United States Patent
Miura et al.

(10) Patent No.: US 8,773,919 B2
(45) Date of Patent: Jul. 8, 2014

(54) SEMICONDUCTOR DEVICE AND DATA PROCESSING SYSTEM

(75) Inventors: Seiji Miura, Hachioji (JP); Satoru Hanzawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 365 days.

(21) Appl. No.: 13/300,139

(22) Filed: Nov. 18, 2011

(65) Prior Publication Data

US 2012/0134203 A1     May 31, 2012

(30) Foreign Application Priority Data

Nov. 30, 2010    (JP) ................................. 2010-266343

(51) Int. Cl.
| | | |
|---|---|---|
| G11C 7/00 | (2006.01) | |
| G11C 13/00 | (2006.01) | |
| G11C 8/08 | (2006.01) | |
| G11C 8/18 | (2006.01) | |

(52) U.S. Cl.
CPC ........ *G11C 13/0007* (2013.01); *G11C 13/0004* (2013.01); *G11C 13/0069* (2013.01); *G11C 8/08* (2013.01); *G11C 13/0097* (2013.01); *G11C 13/0061* (2013.01); *G11C 2211/5623* (2013.01); *G11C 13/004* (2013.01); *G11C 8/18* (2013.01)
USPC ............ 365/189.04; 365/189.05; 365/189.15; 365/189.16

(58) Field of Classification Search
CPC .......................... G11C 13/0004; G11C 13/0069
USPC ............. 365/189.04, 189.05, 189.15, 189.16, 365/185, 365/185.29
See application file for complete search history.

(56) References Cited

U.S. PATENT DOCUMENTS

| | | | |
|---|---|---|---|
| 6,728,161 B1 * | 4/2004 | Roohparvar | ................ 365/233.1 |
| 6,760,254 B2 * | 7/2004 | Taura | ....................... 365/185.11 |
| 8,400,830 B2 | 3/2013 | Ishikawa et al. | |
| 2006/0190672 A1 | 8/2006 | Fuji | |
| 2007/0053224 A1 | 3/2007 | Happ et al. | |
| 2010/0097832 A1 | 4/2010 | Mukai et al. | |
| 2012/0075909 A1 | 3/2012 | Nakura et al. | |
| 2012/0075911 A1 | 3/2012 | Nakura et al. | |

FOREIGN PATENT DOCUMENTS

| | | |
|---|---|---|
| JP | 7-57489 A | 3/1995 |
| JP | 2005-038454 | 2/2005 |
| JP | 2006-221691 A | 8/2006 |
| JP | 2007-525785 A | 9/2007 |

(Continued)

OTHER PUBLICATIONS

Japanese-language Office Action with English translation dated Jul. 30, 2013 (eleven (11) pages).

(Continued)

*Primary Examiner* — Son Dinh
(74) *Attorney, Agent, or Firm* — Crowell & Moring LLP

(57) ABSTRACT

In a phase change memory, when M bit (8 bits=1 byte) data is written, erase operation and program operation are performed in units of n bit (M>n) data. Further, when M bit data is written, program operation is performed in units of the n bit (M>n) data. Further, when M bit data is read from the memory cell, read operation is performed in units of the n bit (M>n) data. For example, when the data is written into to the phase change memory, the data is not overwritten but program is performed after once erasing the target memory cell. The data size for erasure and the data size for program are made equal. Erase and program operation are performed only for the demanded data size.

20 Claims, 21 Drawing Sheets

(56) References Cited

FOREIGN PATENT DOCUMENTS

| | | |
|---|---|---|
| JP | 2008-243263 A | 10/2008 |
| JP | 2010-97662 A | 4/2010 |
| JP | 2012-69220 A | 4/2012 |
| JP | 2012-69221 A | 4/2012 |
| WO | WO 2010/061760 A1 | 6/2010 |
| WO | WO 2010/077414 A1 | 7/2010 |

OTHER PUBLICATIONS

Translation of Notification of Reasons for Refusal in related Japanese Patent Application No. 2013-204417 dated Mar. 4, 2014.

* cited by examiner

SEMICONDUCTOR DEVICE AND DATA PROCESSING SYSTEM

CLAIM OF PRIORITY

The present application claims priority from Japanese Patent Application No. JP 2010-266343 filed on Nov. 30, 2010, the content of which is hereby incorporated by reference into this application.

FIELD OF THE INVENTION

The present invention relates to a semiconductor device, and more particularly to a technique effectively applied to a storage device including a memory cell comprised of elements whose resistance value varies in accordance with stored information, in particular, a storage device including a phase change memory using a memory cell which stores information by using a change in state of a chalcogenide material and discriminates the information by detecting the difference of resistance values in accordance with the information.

BACKGROUND OF THE INVENTION

As a technique examined by the present inventors, for example, the following technique is conceivable in a semiconductor device including a phase change memory. A storage element uses a Ge—Sb—Te based or Ag—In—Sb—Te based chalcogenide material (or phase change material) containing at least antimony (Sb) and tellurium (Te) as a material of a storage layer. Further, a diode is used as a selection element. The characteristics of a phase change memory using a chalcogenide material and a diode are described in, for example, "IEEE International Solid-State Circuits Conference, Digest of Technical Papers", USA, 2007, pp. 472-473.

FIG. 3 is a graph illustrating a relationship between a pulse width and a temperature which are required for phase change of a resistive storage element using a phase change material. When storage information "0" is written in the resistive storage element, such a reset pulse as to heat the element up to a melting point Ta of a chalcogenide material or higher and to rapidly cool the same is applied to the device, as illustrated in FIG. 3. By setting a short cooling time t1, for example, of about 1 ns, the chalcogenide material is changed to a high-resistance amorphous (noncrystalline) state.

On the contrary, when storage information "1" is written, the chalcogenide material is changed to a poly crystal state at a low resistance by applying such a set pulse as to hold the temperature of the resistive storage element in a temperature range lower than the melting point Ta and higher than a crystallization temperature Tx that is higher than or equal to a glass-transition temperature. A time t2 required for crystallization varies depending on the composition of the chalcogenide material. The temperature of the device illustrated in FIG. 3 depends on Joule heat generated from the storage element itself and on thermal diffusion to the environment surroundings.

As the size of the structure of the resistive storage element is decreased in the phase change memory, electric power required for the change of the state of the phase change film is decreased. Therefore, the structure tends to be decreased, in principle, as described in "IEEE International Electron Devices meeting, TECHNICAL DIGEST" (USA), 2001, pp. 803-806.

Further, "IEEE International Solid-State Circuits Conference, Digest of Technical Paper" (USA) 2004, SESSION 2/NON-VOLATILE MEMORY, p. 1-2 describes a phase change memory requiring about 120 ns for lowering the resistance and about 500 ns for increasing the resistance of the chalcogenide material Further, Japanese Unexamined Patent Publication No. 2006-24355, Japanese Unexamined Patent Publication No. 2008-27522, and Japanese Unexamined Patent Publication No. 2009-193629 show programming methods for phase change memory devices.

SUMMARY OF THE INVENTION

The present inventors, et al. investigated a method of controlling a NAND flash memory utilized for storage devices such as SSD (Solid State Drives), memory cards, etc. prior to the filing of the present application. Further, characteristics of the resistance value of a phase change memory using a storage layer comprising a chalcogenide material and diode were also studied.

<<Investigation on NAND Flash Memory>>

A 4 Gbit NAND flash memory comprises a page of (2048+64) bytes, a block having 64 pages and chips having 4096 blocks.

Further, SSD comprises multiple NAND flash memories and a flash controller controlling the flash memories. Further, a host controller and SSD are connected by way of a SATA interface and the host controller controls data stored in SSD according to logical address (LBA: Logical Block Address) in units of the minimum 512 bytes.

A write operation when a write instruction for 512 byte data is generated from the host controller to SSD is to be described.

When the data is written into the NAND flash memory, it is necessary to write on the page unit to a block in a erased state in the NAND flash memory.

If a block in the erased state is present, data can be written into the block. However, since 512 bytes are smaller than the 1 page data, the flask controller writes 512 byte data to the flash memory by the following procedures.

(1) The flash controller once reads 1 page data from the flash memory (read time: 82.8 µs=30 µs (25 ns×2112)).
(2) The flash controller writes 512 byte data to the read 1 page data (update time: 10 ns).
(3) The flash controller writes the updated 1 page data to the flash memory (write time: 352.8 µs=(25 ns×2112)+300 µs).

The write processing takes about 435 µs.

If a block in an erased state is not present, it is necessary to once erase 1 block and write data on the page unit. However, since 512 bytes are smaller than 1 page data, the flask controller writes 512 byte data to the flash memory by the following procedures.

(1) The flash controller reads 1 block data (5.3 ms=82.8 µs×64).
(2) The flash controller writes the 1 block read data to other block (22.6 ms=352.8 µs×64).
(3) The flash controller erases 1 block (2.5 ms).
(4) The flash controller once reads 1 page data from the flash memory (read time: 82.8 µsec=30 µsec+(25 ns×2112)).
(5) The flash memory writes 512 byte read data to the 1 page read data (update time: 10 ns).
(6) The flash controller writes updated 1 page data to the flash memory (write time: 352.8 µs=(25 ns×2112)+300 µs).

The write processing takes about 30.8 ms.

As described above, since the NAND flash memory does not operate on the data unit that is controlled easily as a storage from the host, this is a memory difficult to be used as the storage. Since the erased date size of the NAND flash memory, the page size, and the size of data intended to be written from the host are not identical, it has been found a problem that the write time is extremely increased.

<<Investigation on Phase Change Memory>>

In the writing to the phase change memory cell, the resistance value of the phase change memory is controlled by controlling the Joule heat generated by a current. It has been found a problem that the resistance values vary after usual rewrite operation due to the difference of the electric characteristic of the memory cell caused by the thermal hysteresis due to the Joule heat.

Further, when data is overwritten to the phase change memory cell, since the resistance values vary depending on the difference in the state after writing, it has been found that variation of the resistance between memory cells is increased to result in a significant effect on the characteristic.

Then, the present invention intends to provide a phase change memory capable of operating at a high speed and easy to handle with. The foregoing and other objects and novel features of the invention will become apparent by reading the descriptions of the present specification with reference to the appended drawings.

Among the inventions disclosed in the present application, outline of the typical inventions are to be briefly described as below.

That is, when M bit (8 bits=1 byte) data is written in the phase change memory, it has a feature of performing erase operation and program operation in units of n bit (M>n) data. Further, when M bit data is written, it has a feature of performing program operation in units of n bit (M>n) data. Further, when M bit data is read from the memory cell, it has a feature of performing the read operation in units of n bit (M>n) data.

The effects obtained by typical inventions among those disclosed in the present application are to be described specifically. The present invention can provide a phase change memory capable of operating at high operation speed and easy to handle with.

BRIEF DESCRIPTION OF THE DRAWINGS

FIG. 2 shown an embodiment of the present invention in which

FIG. 3 shows an embodiment of the invention in which

FIG. 6 shows an embodiment of the invention in which

FIG. 7 shows an embodiment of the invention in which

FIG. 14 shows an embodiment of the invention in which

FIG. 16 shows examples (W(a)-(e)) of the operation of an information processing system as an embodiment of the invention, in which FIG. 16A is a view writing 512 byte data, FIG. 16B is a view for writing 1 Kbyte data, FIG. 16C is a view for writing 2 Kbyte data, FIG. 16D is a view for writing 8 Kbyte data, and FIG. 16E is a view for writing 10 Kbyte data;

FIG. 17 shows examples (R(a)-(e)) of the operation of an information processing system as an embodiment of the invention, in which FIG. 17A is a view for reading 512 byte data, FIG. 17B is a view for reading 1 Kbyte data, FIG. 17C is a view for reading 2 Kbyte data, FIG. 17D is a view for reading 8 Kbyte data, and FIG. 17E is a view for reading 10 Kbyte data;

FIG. 18 show an embodiment of the invention, in which

FIG. 19 show an embodiment of the invention, in which

FIG. 21 shows a modified example of an embodiment of the invention in which

DETAILED DESCRIPTION OF THE PREFERRED EMBODIMENTS

Figure 1:
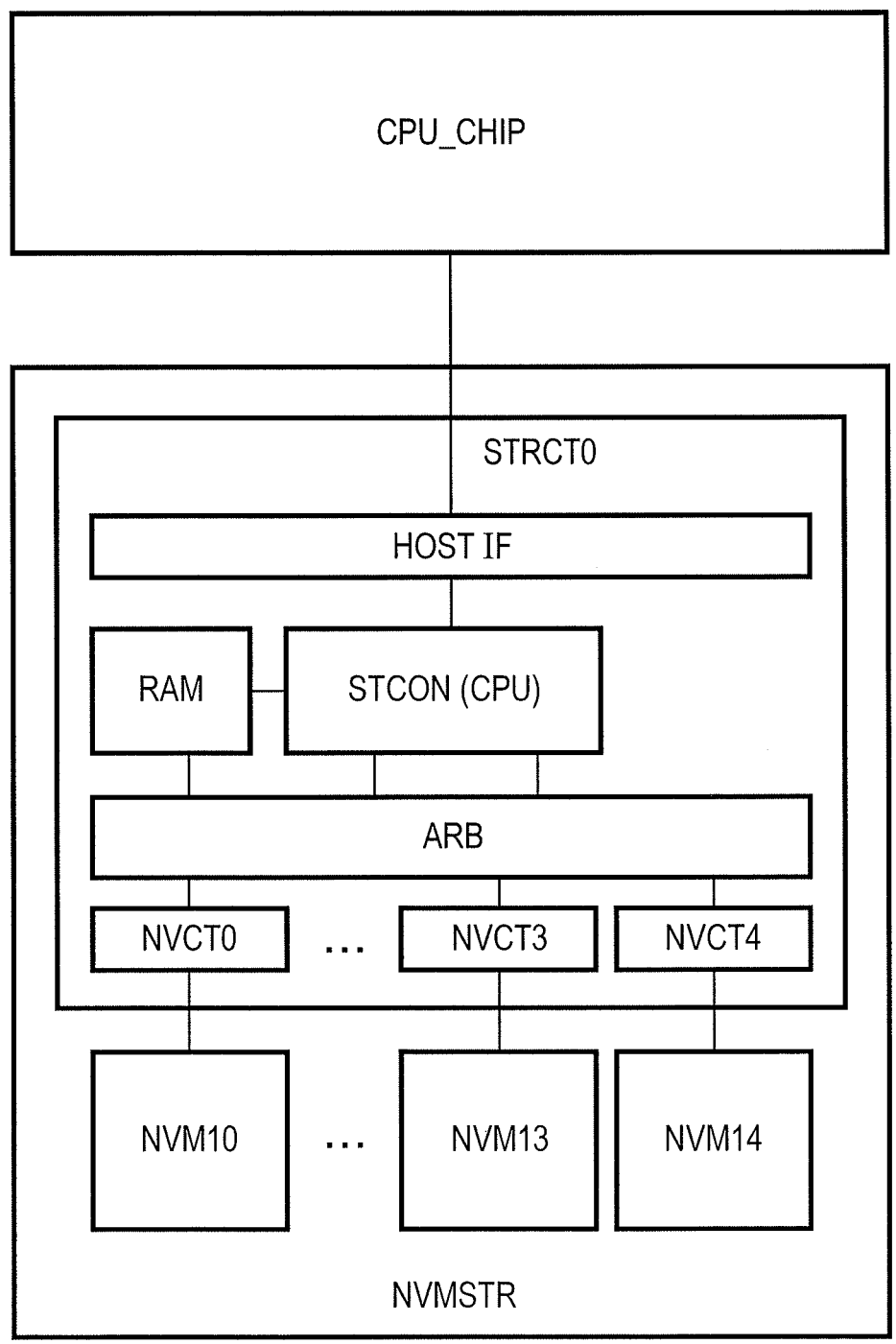
FIG. 1 is a block diagram showing an example of a configuration of an information processing system as an embodiment according to the present invention.

Preferred embodiments of the present invention are to be described specifically with reference to the drawings.

Throughout the drawing for explaining the embodiments, identical components carry the same references, in principle, for which duplicate descriptions are to be omitted.

Further, in the embodiments, circuit elements constituting each of the blocks are not particularly restricted and they are formed on a single crystal semiconductor substrate formed of single crystal silicon, etc. by the known integrated circuit technology such as CMOS (Complementary MOS transistor). Further, for the memory cells, resistive storage elements such as phase change memory or ReRAM (Resistive Randam Access Memory) are used. Particularly, the configuration in the case of using the phase change memory, it is represented by those shown in FIG. 2 and FIG. 3.

Further, unless otherwise specified particularly, specific numerical value are those used for explaining the invention and not particularly restricted to the such values.

<<Outline of the Invention of the Embodiment>>

As in a typical object of this embodiment, writing of data to a phase change memory as a semiconductor device is not performed by overwriting data but the state of the phase change memory cell is once set to an amorphous state or a crystalline state, and then desired data is written. Further, it is intended to provide a phase change memory easy to handle with that operates on data unit ease to be controlled as a storage from a host.

For attaining the typical object of this embodiment, in a typical feature of this embodiment for the phase change memory as a semiconductor device, a method of writing M byte (1 byte=8 bits) data to a phase change memory cell is performed by collectively erasing n byte memory cells after receiving a write instruction (setting n bit "0" to high resistance), programming them (setting only "1" data to low resistance) and repeating them by M/n times.

The phase change memory has multiple data buffers and data is written into a designated data buffer by a write command designating the data buffer.

The phase change memory has multiple data buffers and data is written from the designated data buffer into the memory cell by a program command designating the data buffer into the memory cell.

The phase change memory comprises pages, sectors, blocks, and banks and all data in the memory cell selected by an erase command are set to "0" or "1". Erase command supported by the phase change memory includes page erasure, sector erasure, block erasure, bank erasure, and chip erasure.

For the phase change memory, the method of reading M byte (1 byte=8 bits) data from the phase change memory cell includes selecting memory cell on every n bytes after receiving a read instruction and then reading data on every n bytes, and repeating the procedure by M/n times.

The phase change memory has multiple data buffers and reads data from the memory cell and transfers the data to the designated data buffer by a load command designating the data buffer. The load command supported by the phase change memory is a sector load and a multi-sector load.

The phase change memory has multiple data buffers and reads data from the designated data buffer by a read command designating the data buffer.

According to the typical features of this embodiment described above, a phase change memory capable of transferring data at high speed and ease to handle with suitable to storage can be attained as a typical effect of this embodiment for the phase change memory as the semiconductor device, since the phase change memory cell is once set to amorphous state or a crystalline state, then desired data is written and, further, the memory operates on the data unit ease to be controlled from the host as a storage, and performs write and read operation in accordance with the data size upon request of writing or reading from the host.

An information processing system as an embodiment according to the invention based on the outline of this embodiment is to be described specifically.

<<Information Processing System>>

An information processing system in an embodiment according to the invention is to be described with reference to FIG. 1 to FIG. 20.

FIG. 1 is a block diagram showing an example of a configuration of an information processing system as an embodiment according to the present invention.

The information processing system in this embodiment comprises an information processing unit CPU_CHIP that functions as a host, and a memory module NVMSTR that functions as a storage by the information processing unit CPU_CHIP.

As shown in FIG. 1, the information processing unit CPU_CHIP, not particularly restricted, is a host controller that controls data stored in a memory module NVMSTR by the logical address on minimum 512 byte unit (LBA: Logical Block Address), which reads and writes data to the memory module NVMSTR.

The typical interface technology of connecting the information processing unit CPU_CHIP and the memory module NVMSTR and transferring data between them includes a serial interface technique of transmitting data by electric signals such as a SD card interface, a USB interface, a SATA interface, a SAS interface, a SCSI interface, a PCI Express interface, as well as an optical interface technique of transmitting data by optical signals such as a Light Peak interface and any of such interface techniques can be utilized. Further, it is also possible to utilize parallel interface technique such as DIMM (Dual Inline Memory Module).

The memory module NVMSTR comprises memory devices NVM10 to NVM14, and a control circuit STRCT0 for controlling the memory devices.

The control circuit STRCT0 comprises an interface circuit HOST_IF, a memory device RAM, an arbiter circuit ARB, an information processing circuit STCON (CPU) and memory control devices NVCT0 to NVCT4 for directly controlling the memory devices NVM10 to NVM14 respectively. The memory device RAM may be either a volatile memory or non-volatile memory.

The memory devices NVM10 to NVM14 are non-volatile memory semiconductor devices each having identical configuration and performance.

The function of each of the devices and the circuits constituting the information processing system described above is explained for each of the operations to be described later.

Figure 2A:
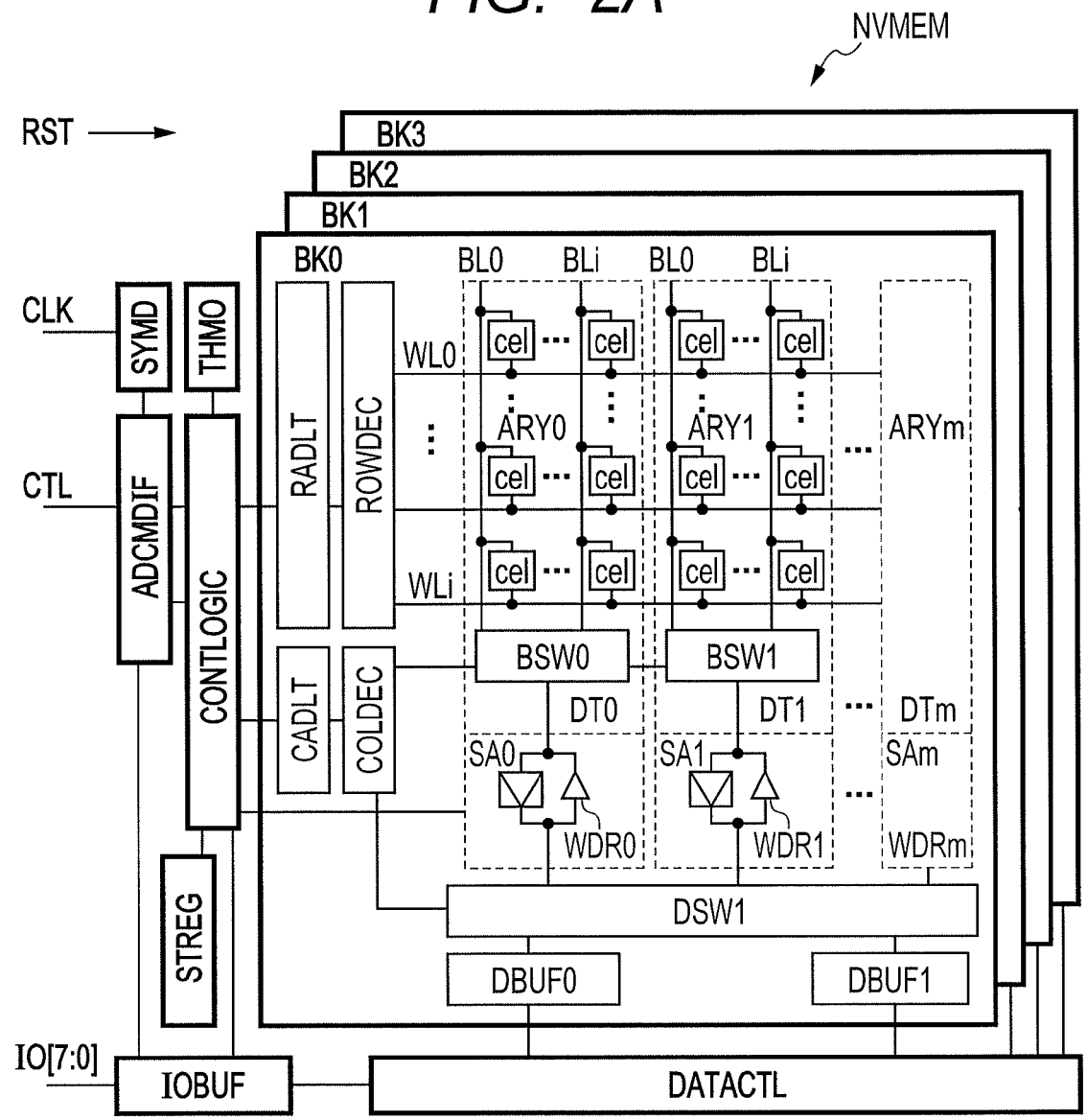
FIG. 2A is a block diagram showing an example of a circuit structure of a phase change memory device and FIG. 2B is a circuit diagram showing an example of a circuit structure of the memory cell device.
Figure 2B:
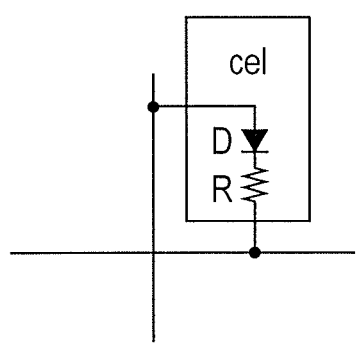

Further, FIG. 2 is a block diagram showing an example of a circuit structure of the non-volatile memory NVMEM utilized as the memory devices NVM10 to NVM14 and a phase change type non-volatile memory is shown as an example. FIG. 2A shows a circuit structure of the non-volatile NVMEM and FIG. 2B shows a circuit structure of the memory cell respectively.

The non-volatile memory NVMEM comprises a clock generation circuit SYMD, a status register STREG, an address and command (address/command) interface circuit ADCMDIF, an IO buffer IOBUF, a control circuit CONT-LOGIC, a temperature sensor THMO, a data control circuit DAKACTL, and memory banks BK0 to BK3.

Each of the memory banks BK0 to BK3 includes a memory array ARYx (x=0 to m), a low address latch circuit RADLT, a column address latch circuit CADLT, a row decoder ROW- DEC, a column decoder COLDAC, a data selection circuit DSW1, a data buffer DBUF0, and a data buffer DBUF1.

Each of the memory arrays ALYx (x=0 to m) includes multiple memory cells cel, a bit line selection circuit BSWx (x=0 to m), a sense amplifier SAx (x=0 to m), and a write driver WDRx (x=0 to m).

Each of the memory cells cel is a memory cell including a rewritable resistive storage element (resistance: R+diode: D) disposed at an intersection between multiple word lines WL0 to WLi and multiple bit lines BL0 to BLi that intersect the word lines. Each of the bit line selection circuits BSW0 to BSWm, the sense amplifiers SA0 to SAm, the write drivers WDR0 to WDRm is connected by data lines DT0 to D™.

A clock signal CLK, a reset signal RST, and a control signal SLT are inputted to the non-volatile memory NVMEM from the outside and an I/O signal IO [7:0] is inputted and outputted from and to the outside and inside.

The control signal CTL comprises a command latch enable signal CLE, a chip enable signal CEB, an address latch enable signal ALE, a write enable signal WEB, a read enables signal REB, and a ready busy signal RBB.

The I/O signal IO [7:0] is an input/output signal, in which command, address and write data are inputted and read data are outputted.

The function of each of the circuit constituting the non-volatile memory NVMEM described above is as described for each of the operation to be described later.

<<Memory Map of Non-Volatile Memory NVMEM>>

FIG. 14 shows an example of a memory map of the non-volatile memory NVMEM shown in FIG. 2. Although not restricted particularly, the non-volatile memory NVMEM comprises a page, a sector having multiple pages and a block having multiple sectors.

Figure 14A:
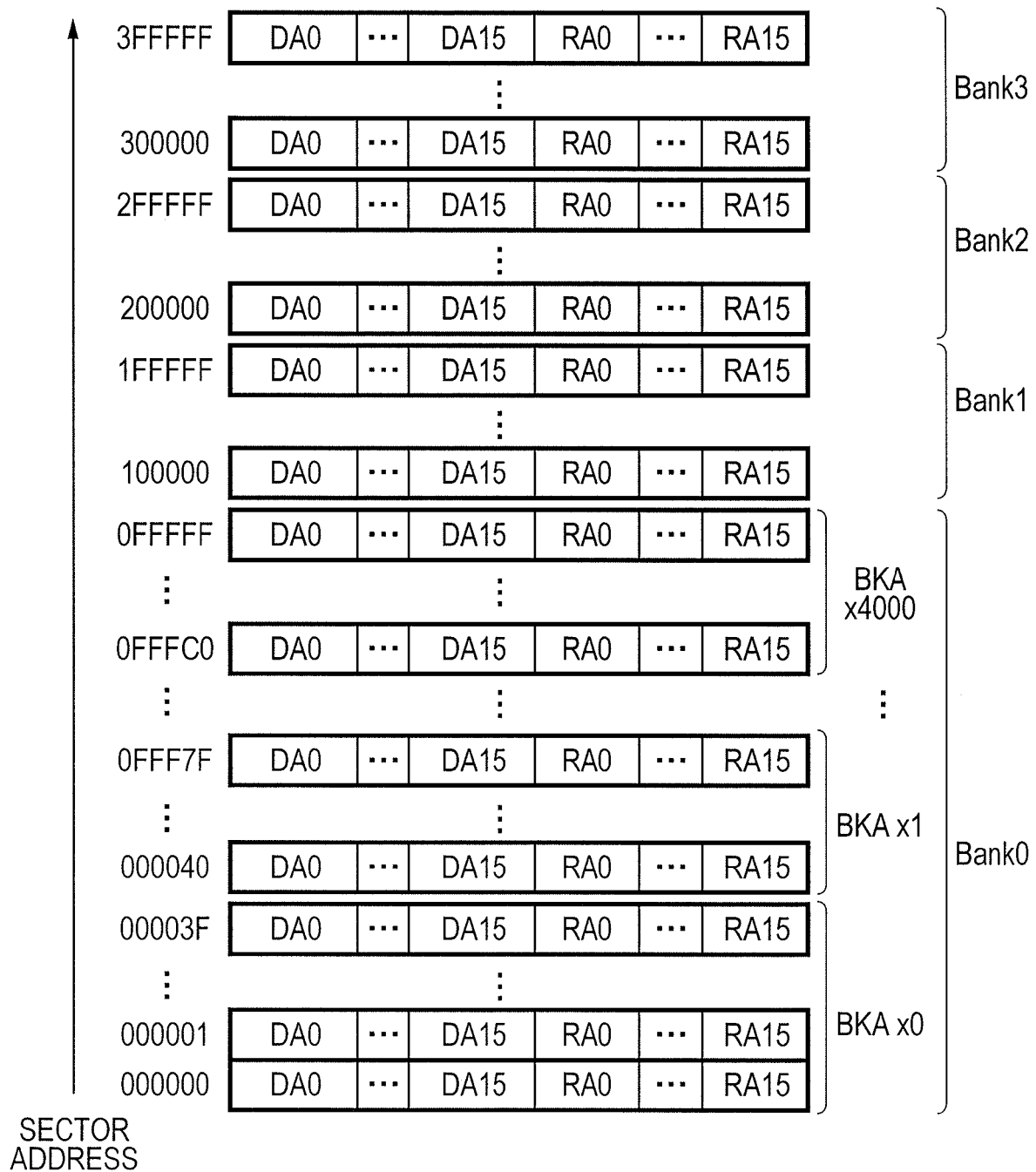
FIGS. 14A, 14B show an example of memory map of a phase change memory device.
Figure 14B:
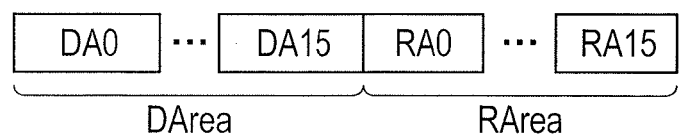

FIG. 14B shows a configuration of 1 sector having multiple pages. Although not particularly restricted, 1 page comprises a 512 byte data region (DA0 to DA15) and a 16 byte redundance region (RA0 to RA15) and 16 pages are collected to form 1 sector.

The data region stores program or data, while the redundance region stores ECC parity information necessary for detecting an error and correcting data and defective page information showing that the page becomes defective.

Each of DA0 to DA15 is a 512 byte data region and each of RA0 to RA15 is a 16 byte redundance region respectively.

The page 0 address comprises a data region DA0 and a redundance region RA0, the page 1 address comprises a data region DA1 and a redundance region RA1, the page 2 address comprises a data region DA2 and a redundance region RA2, the page 3 address comprises a data region DA3 and a redundance region RA3, the page 4 address comprises a data region DA4 and a redundance region RA4, the page 5 address comprises a data region DA5 and a redundance region RA5, the page 6 address comprises a data region DA6 and a redundance region RA6, the page 7 address comprises a data region DA7 and a redundance region RA7, the page 8 address comprises a data region DA8 and a redundance region RA8, the page 9 address comprises a data region DA9 and a redundance region RA9, the page 10 address comprises a data region DA10 and a redundance region RA10, the page 11 address comprises a data region DA11 and a redundance region RA11, the page 12 address comprises a data region DA12 and a redundance region RA12, the page 13 address comprises a data region DA13 and a redundance region RA13, the page 14 address comprises a data region DA14 and a redundance region RA14, and the page 15 address comprises a data region DA15 and a redundance region RA15.

FIG. 14A shows a memory map for the entire non-volatile memory NVMEM comprising multiple sectors.

The sector address includes addresses 000000 to 3FFFFF in hexadecimal and 128 sectors constitute 1 block.

Further, addresses 000000 to 0FFFFF of the sector address show a region of a bank 0 (Bank0), addresses 100000 to 1FFFFFF of the sector address show a region of a bank 1 (Bank1), addresses 200000 to 2FFFFFF of sector address show a region of a bank 2 (Bank2), and addresses 300000 to 3FFFFFF of the sector address show a region of a bank 3 (Bank3).

<<Operation Just after Turning on Power Source>>

Figure 13:
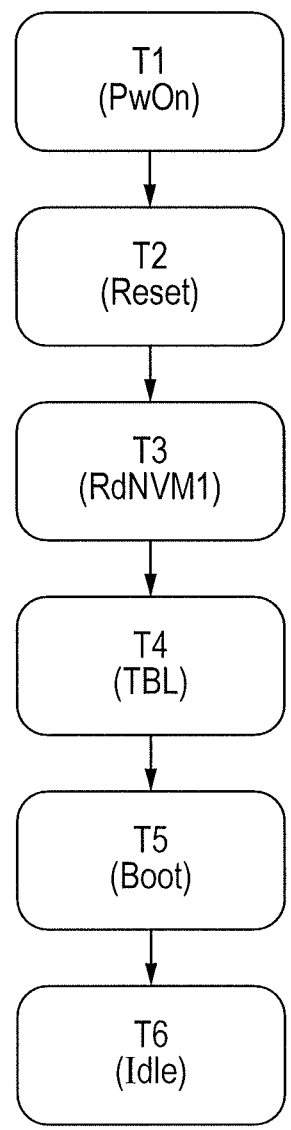
FIG. 13 shows an example of the operation of a memory module just after putting on a power source in an embodiment of the invention.
Figure 15:
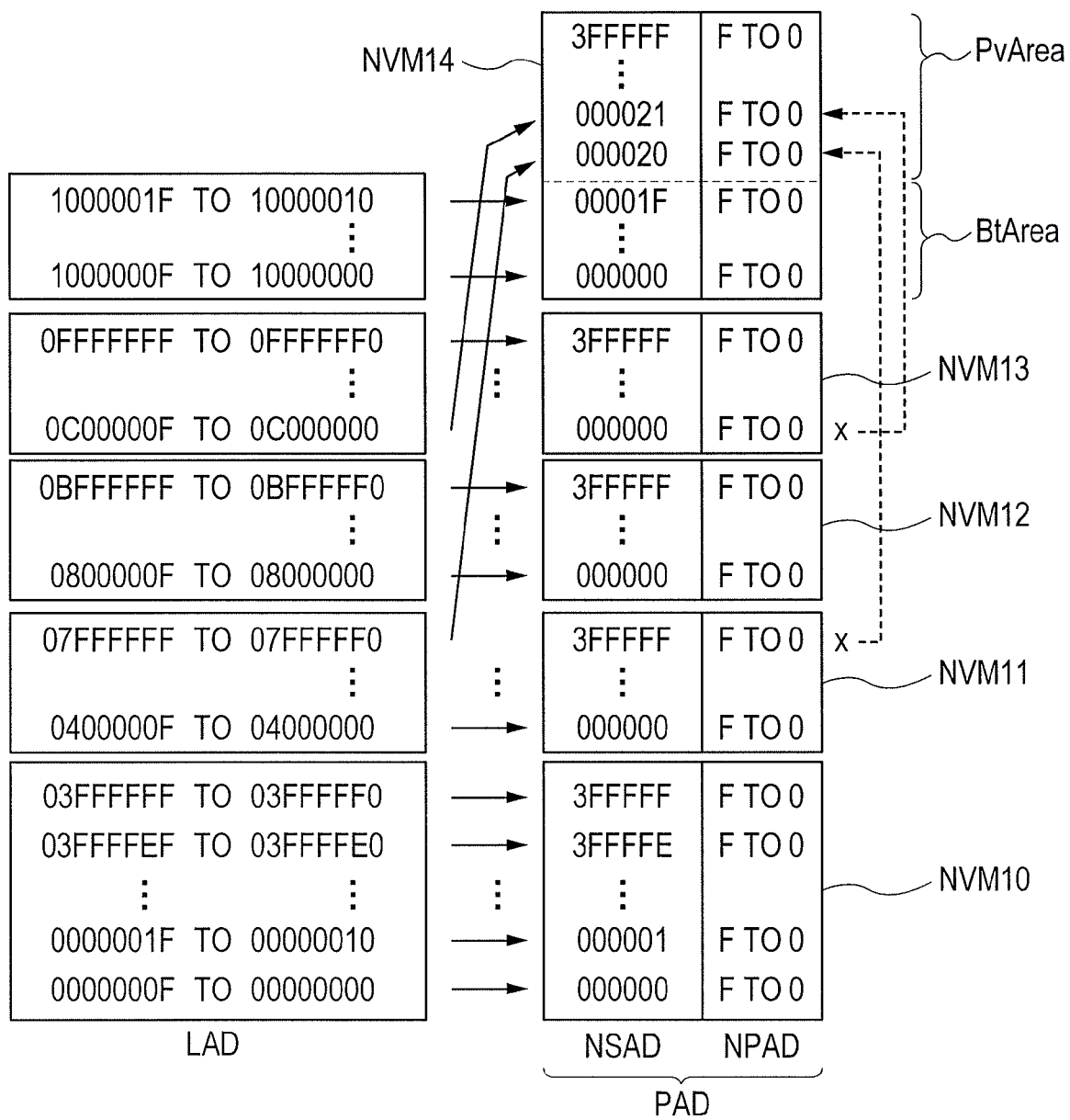
FIG. 15 shows an example of correspondence between logical address and physical address in an information processing system as an embodiment according to the present invention.
Figure 16:
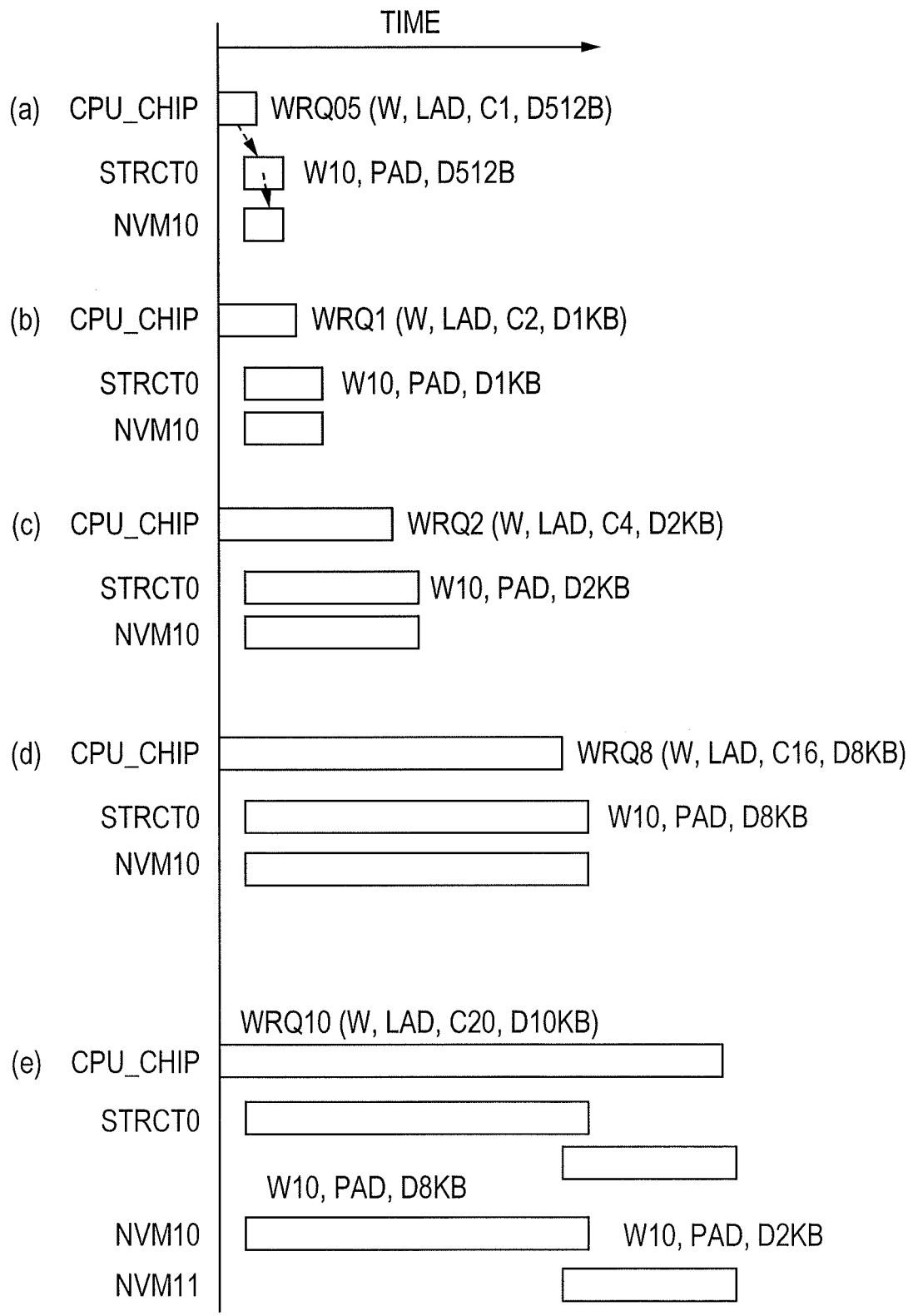
Figure 17:
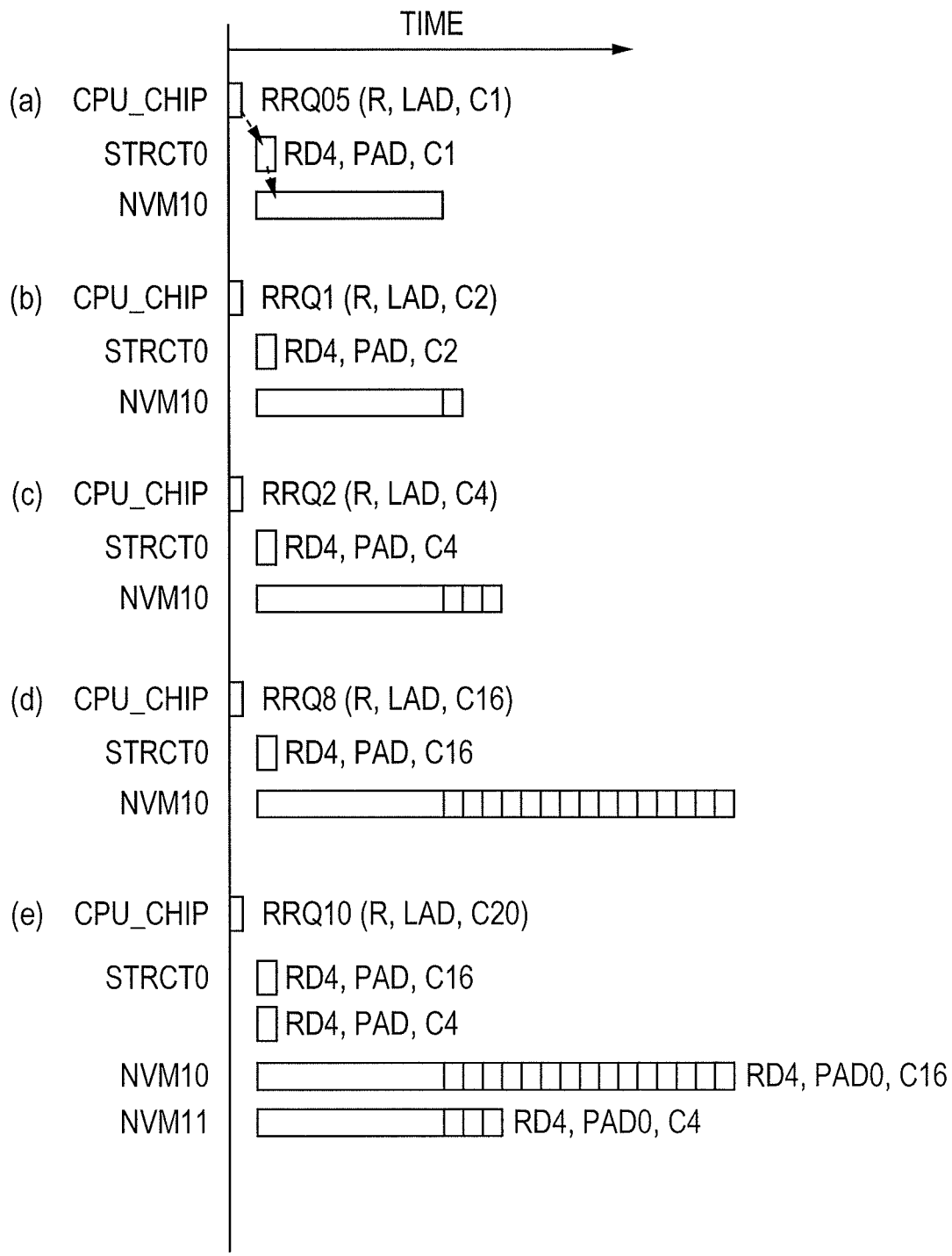

FIG. 13 shows an example of initialize operation just after turning on a power source to the information processing unit CPU_CHIP and the memory module NVMSTR. FIG. 15 is a correspondence table TLTBL between the logical address LAD inputted from the information processing unit CPU_CHIP to the memory module NVMSTR generated from the information processing circuit STCON (CPU) upon initialization operation shown in FIG. 13 and the physical address PDA of the memory devices NVM10 to NVM14 (sector address NSAD+page address NPAD).

When a power source is turned on during a period T1 (PwOn), all the circuits in the control circuit STRCT0 are initialized during a reset period T2 (Reset), and the memory devices NVM10 to NVM 14 are also initialized.

Then, in the next period T3 (RdNVM1), the information processing circuit STCON (CPU) reads redundance regions corresponding to all pages in the memory devices NVM10 to NVM14 by way of the arbiter circuit ARB and the memory control circuits NVCT0 to NVCT4 and judges whether they are normal page or defective page.

Then, during the next period of T4 (TBL), the information processing circuit STCON (CPU) prepares a correspondence table TLTBL between the logical address LAD and the physical address PAD based on the result of judgment in the period T3 and stores them in the memory device RAM.

In the next period T5 (Boot), the information processing circuit STCON (CPU) reads a boot program stored in the boot region BtArea of the memory device NVM14 and stores the same in the memory device RAM.

In the next period T6 (Idle) after the completion of T5, the memory module NVMSTR changes into an idle state and can accept the access from the information processing unit CPU_CHIP.

In a case where the information processing unit CPU_CHIP rises itself by utilizing the boot program in the memory module NVMSTR, when the information processing unit CPU_CHIP inputs the logical address LAD (Hex 10000000 to 1000001F) to the memory module NVMSTR, the boot program stored in the memory device RAM is read and transferred to the information processing unit CPU_CHIP.

While the corresponding table TLTBL prepared by the information processing circuit STCON (CPU) in the period of T4 (TBL) in FIG. 13 is shown as an example stored in the memory device RAM, but the correspondence table TLTBL can also be stored in the memory devices NVM10 to NVM14.

<<Correspondence Table Between Logical Address LAD and Physical Address PAD>>

FIG. 15 is a correspondence table TLTBL between the logical address LAD prepared by the information processing circuit STCON (CPU) and inputted LAD from the information processing unit CPU_CHIP to the memory module NVMSTR during the initialize operation in FIG. 13 and the physical address PAD (sector address NSAD+page address NPAD) in the memory devices NVM10 to NMB14.

Although not restricted particularly, the logical address LAD is represented by a logic page address of 512 byte data as one unit. The logical address LAD includes addresses from 0 to 1000001F in hexadecimal, in which OS, application program, and data are stored at addresses 0 to FFFFFFF, and the boot program is stored at addresses 10000000 to 1000001F.

Although not particularly restricted, the physical address PAD (address designated by the sector address NASD and the page address NPAD) is represented by the physical page address of 512 byte data as one unit.

Specifically, this is a physical address designated by a sector address NASD of 8 K byte data as one unit and a page address NPAD of 512 byte data as one unit in the sector address NASD.

The information processing circuit STCON (CPU) reads redundance regions corresponding to the entire pages of the memory devices NVM10 to NVM14 through the arbiter circuit ARB and the memory control circuit NVCT0 and judges whether the respective pages are normal or defective. As a result of the judgment, the information processing circuit STCON (CPU) establishes a correspondence between the logical address LEA and the physical address PAD as described below.

(1) Since the entire physical addresses PAD in the memory device NVM10 are normal, addresses 0 to 03FFFFFF of the logical address LAD correspond to addresses 0 to 3FFFFFF of the physical address PAD in the memory device NVM10.
(2) Since addresses 0 to 3FFFFFE of the physical address PAD in the memory device NVM11 are normal and the address 3FFFFFF is defective, addresses 04000000 to 07FFFFFE of the logical address LAD correspond to addresses 0000000 to 3FFFFFE of the physical address PAD in the memory device NVM11, and the address 07FFFFFF of the logical address LAD corresponds to the address 000021F of the physical address PAD in the substitution region PvArea of the memory device NVM14.
(3) Since the entire physical addresses PAD in the memory device NVM12 are normal, addresses 08000000 to 0BFFFFFF of the logical address LAD correspond to addresses 0 to 3FFFFFF of the physical address PAD in the memory device NVM12.
(4) Since addresses 0 to 3FFFFFE of the physical address PAD in the memory device NVM13 are normal and address 3FFFFFF is defective, addresses 00000000 to 0FFFFFFE of the logical address LAD correspond to addresses 0000000 to 3FFFFFE of the physical address PAD in the memory device NVM13, and address 0FFFFFFF of the logical address LAD corresponds to address 000021F of the physical address PAD in the substitution region PvArea of the memory device NVM14.
(5) Since the entire physical addresses PAD in the memory device NVM14 are normal, addresses 10000000 to 1000001F of the logical address LAD correspond to addresses 0000000 to 00001FF of the physical address PAD in the memory device NVM14, where a boot program is stored.

Further, a substitution region PvArea is secured to addresses 0000200 to 3FFFFFF of the physical address PAD in the memory device NVM14.

The phase change memory or ReRAM is limited for the number of rewire times and the reliability is lowered by repeating rewriting, and it occasionally occurs that the data written upon writing changes into a different data upon reading, or data is not written upon rewriting.

The substitution region PvArea is provided so as to replace the data at the defective address (address 3FFFFFF of the physical address PAD in the memory device NVM11, address 3FFFFFF of the physical address PAD in the memory device NVM13) to a new region. While the size of the substitution region is not particularly restricted, it may be decided so as to ensure the reliability of the phase change memory or ReRAM.

Although not restricted particularly, OS, application program, and data are stored at addresses 0 to FFFFFFF of the logical address LAD and the boot program is stored at addresses 10000000 to 1000001F.

<<Write Operation>>

Figure 4:
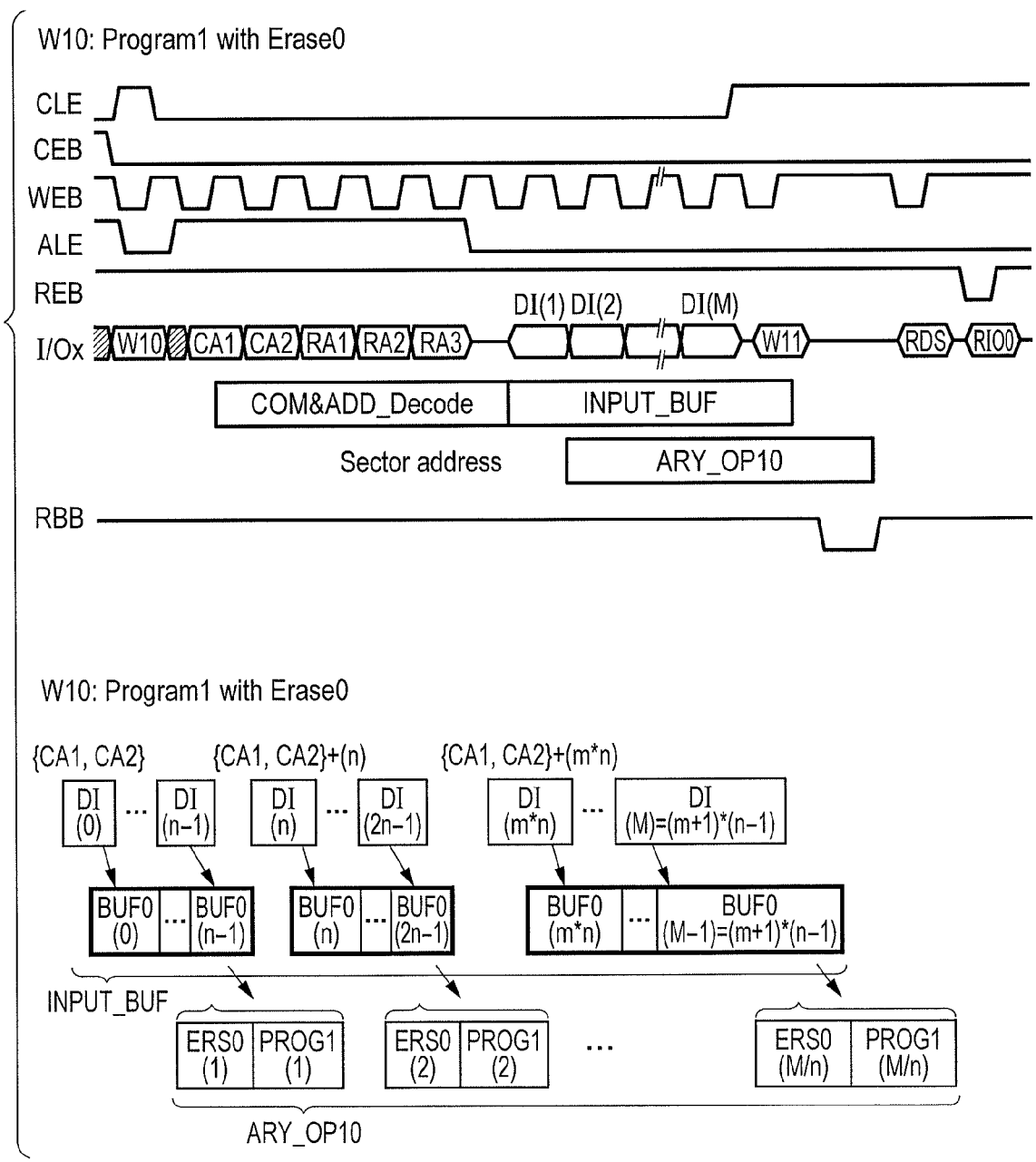
FIG. 4 shows operation waveforms and an example of internal operation (W10) of a phase change memory device in an embodiment of the present invention.

FIG. 4 shows an example of write operation when the non-volatile memory device NVM1x (x=0 to 4) writes M byte data by way of the data buffer DBUF0 to the memory cell cel. "*" such as "m*n" in FIG. 4 in each of the succeeding drawings means "×" (multiplication).

A command latch enable signal CLE at a low level is driven into a high level and a chip enable signal CEB and a address latch enable signal ALE at a high level are driven to a low level. Then, when a write command W10 is inputted by way of the input/output line I/Ox (x=0 to 7), a write command W10 is put by the rising edge of the write enable signal WEB into the address command interface circuit ADCMDIF and decoded. Further, the command W10 also contains information for designating the data buffer DBUF0 or DBUF1 and the data buffer DBUF0 is designated in the example of FIG. 4.

Then, the command latch enable signal CLE at the high level is driven to a low level, and the address latch enable signal ALE at the low level is driven to a high level respectively. The column address is inputted in two steps (CA1, CA2) and the row address is inputted in three steps (RA1, RA2, RA3) orderly. The addresses are put into the address command interface circuit ADCMDIF by the rising edge of the write enable signal WEB and decoded.

As a result of decoding the address command W10 in the address command interface circuit ADCMDIF, when it is transmitted to the control circuit CONTLOGIC that this is the read instruction to the memory bank BK0, the control circuit CONTLOGIC activates the memory bank BK0 for reading the data from the memory bank BK0.

The row address (RA1, RA2, RA3) and the column address (CA1, CA2) inputted to the address command interface circuit ADCMDIF are transferred by way of the control circuit CONTLOGIC respectively to the activated row address latch circuit RADLT of the memory bank BK0 and transferred to the column address latch circuit CADLT. The write operation is started from the column address inputted initially.

The row address (RA1, RA2, RA3) is transferred from the row address latch circuit RADDLT to the row decoder ROWDEC, and the word line WLn corresponding to the row address (RA1, RA2, RA3) is selected by the row decoder ROWDEC.

Then, the column address (CA1, CA2) is transferred from the column address latch circuit CADLT to the column decoder COLDEC and decoded.

The result of decoding from the column decoder COLDEC is inputted to the bit line selection circuit BSW0-n of each of the memory arrays (ARY0-n), one bit line BL is selected on every memory array, and connected by way of the data line DT0-n to a write driver WDR0-n.

Figure 3A:
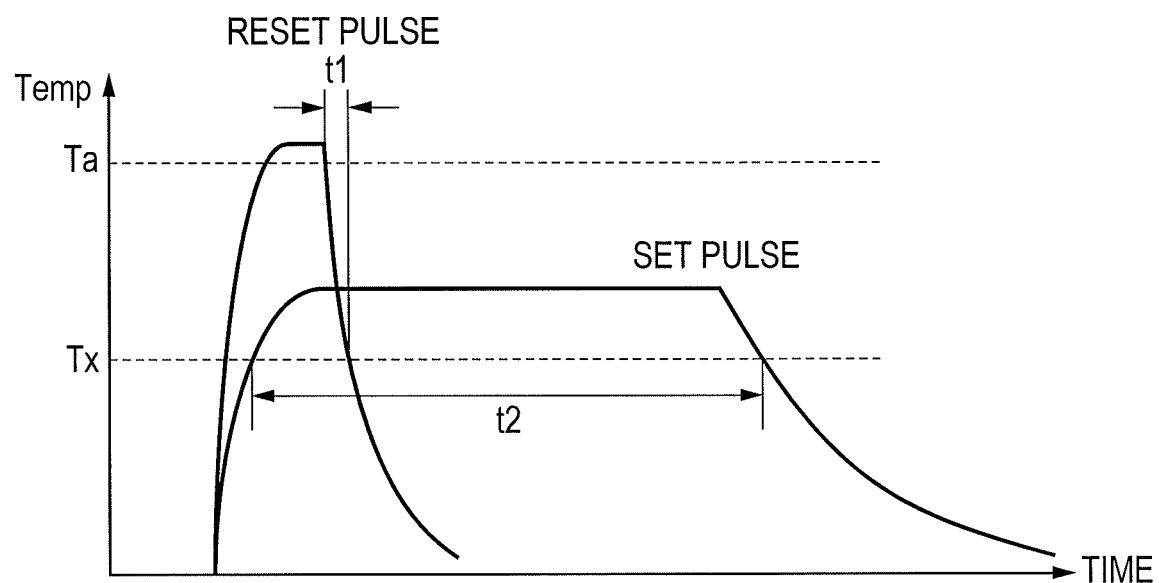
FIG. 3A is a graph showing a relation between a pulse width and a temperature necessary for phase change of a resistive element using a phase change material and FIG. 3B is a view showing a circuit of the memory cell device.
Figure 3B:
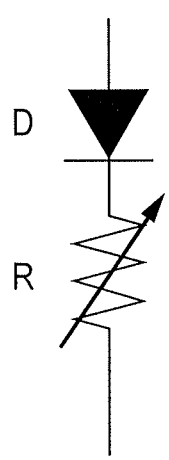

The write driver WDR0-n is a current supply circuit for driving the selected memory cell cel to a low resistance state or high resistance state by way of the data line DT0-n by a current pulse as shown in FIG. 3.

When the memory cell cel is driven to the high resistance state, that is, when the storage information "0" is written, the memory cell current Icell applied by way of the data line DT0-n is controlled to a value Ireset necessary for the reset operation.

When the memory cell cel is driven to the low resistance state, that is, when the storage information "1" is written, the memory cell current Icell applied by way of the data line DT0-n is controlled to a value Iset necessary for the reset operation.

Since the write drivers WDR are present by the number of n×8 in total in one memory bank, data can be written by the number of n bytes simultaneously into the memory cells cel in one memory bank.

Then, the address latch enable signal ALE at the high level is driven to a low level and storage information DI (1) to DI (M) are successively inputted into the data buffer DBUF0 for the 1 bit data by way of the input/output line I/Ox (x=0 to 7) in synchronization with the rising edge of the write enable signal WEB.

On every time n byte data is inputted to the data buffer DRBF0, the n byte data is written through the n×8 write drivers WDR. The operation is to be shown below.

At first, data write operation for the first n byte data is to be described.

At the instance the first 1 byte data in the first n byte data is inputted into the data buffer DBUF0, memory cells for the first n bytes selected by the column address (CA1, CA2) through the write driver WDR are driven to a high resistance state (erase: ERS0). Then, at the instance all the first n byte data are inputted to the data buffer DBUF0, only the "1" data among the data stored in the data buffer DBRF0 is driven to a low resistance state by the write driver WDR (program: PROG1). Thus, the first n byte data is written.

Then, the write operation of the second n byte data is to be described.

At the instance the first 1 byte data in the n byte data is inputted to the data buffer DBUF0, the memory cells for the second n bytes selected by the column address {{CM, CA2}+(n)} are driven to the high resistance state (erasure: ERS0). Then, at the instance all the second n byte data are inputted to the data buffer DBUF0, only for the "1" data among the data stored in the data buffer DBUF0, the memory cells are driven to the low resistance state by the write driver WDR (program: PROG1), Thus, the second n byte data is written.

Write operation for the third n byte data is performed in the same manner as the operation described above and the column address in this case is {(CA1, CA2)+(2n)}.

As described above, erase (ERS0) and program (PROG1) are executed for the memory cells cel for n bytes selected by the column address with addition of n multiple number to the starting column address {CA1, CA2} orderly.

When n byte data is written, erase (ERS0) and programming (PROG1) occur by M/n times.

Further, when the data buffer DBUF1 is designated by the write command W10, the data inputted to the data buffer DBUF1 by way of the input/output line I/Ox (x=0 to 7) and held in the data buffer DBUF1 is written into the memory cell cel.

As has been described above, the non-volatile memory device NVM1x (x=0 to 4) performs erase (ERS0) and program (PROG1) only for the required M byte data size upon writing the M byte data.

That is, since the data size for erase (ERS0) and the data size for programming (PROG1) are equal and it is not necessary to erase (ERS0) data for excess address, high speed writing can be attained.

Further, upon write operation, by once setting the target memory cell cel into an erased state without overwriting in the write operation, the resistance value of the memory cell can be made uniform to attain stable write and read operation.

<<Write Operation to Data Buffer>>

Figure 5:
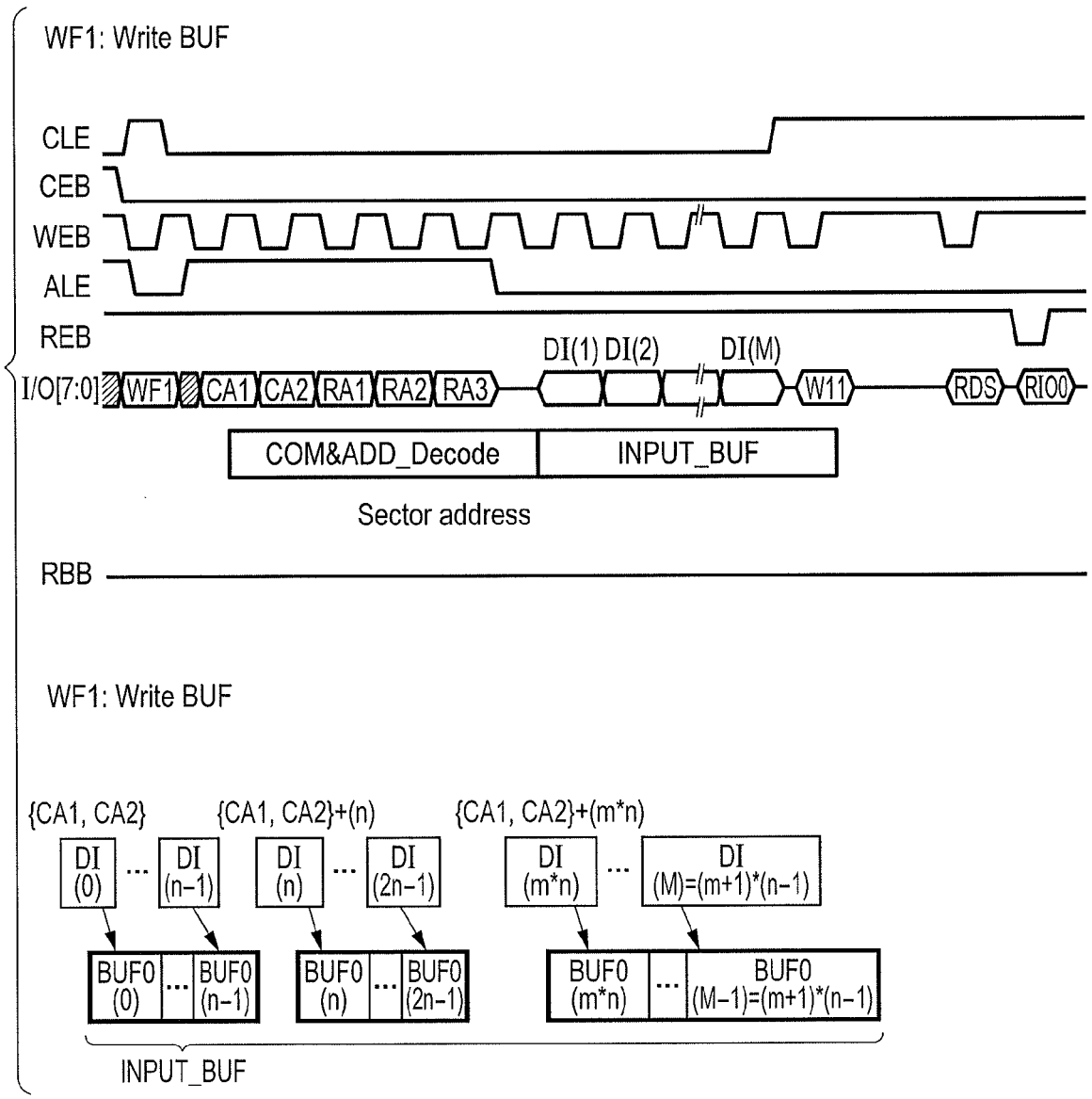
FIG. 5 shows operation waveforms and an example of internal operation (WF1) of a phase change memory device in an embodiment of the invention.

FIG. 5 shows an example of write operation when the non-volatile memory device NVM1x (x=0 to 4) writes Mbyte data to the data buffer DBUF0.

The command latch enable signal CLE at a low level is driven into a high level and the chip enable signal CEB and the address latch enable signal ALE at a high level are driven to a low level. Then, when the write command WF1 is inputted by way of the input/output line I/Ox (x=0 to 7), the data buffer write command WF1 is put by the rising edge of the write enable signal WEB into the address command interface circuit ADCMDIF and decoded. Further, the command WF1 also includes information for designating the data buffer DBUF0 or the DBUF1 and the data buffer DBUF0 is designated in the example of FIG. 5.

Then, the command latch enable signal at the high level is driven to a low level, and the address latch enable signal ALE at the low level is driven to a high level respectively. The column address is inputted in two steps (CA1, CA2) and the row address is inputted in three steps (RA1, RA2, RA3) orderly. The addresses are put into the address command interface circuit ADCMDIF by the rising edge of the write enable signal WEB and decoded.

As a result of decoding the address (CA1, CA2, RA1, RA2, RA3) and the command WF1 by the address command interface circuit ADCMDIF, when it is informed to the control circuit CONTLOGIC that this is the write instruction to the data buffer DBRF0 of memory bank BK0, the control circuit CONTLOGIC activates the data buffer DBUF0 of the memory bank BK0.

Then, the address latching enable signal ALE at a high level is driven to a low level and storage information DI (1) to DI (M) are successively inputted into the data buffer DBUF0 for the 1 bit data by way of the input/output line I/Ox (x=0 to 7) in synchronization with the rising edge of the write enable signal WEB.

When the M byte data is written into the data buffer DBUF0, the write operation is performed by M times.

Further, when the data buffer DBUF1 is designated by the write command WF1, the same write operation occurs to the data buffer DBUF1.

<<Write Operation from Data Buffer to Memory Cell>>

Figure 6A:
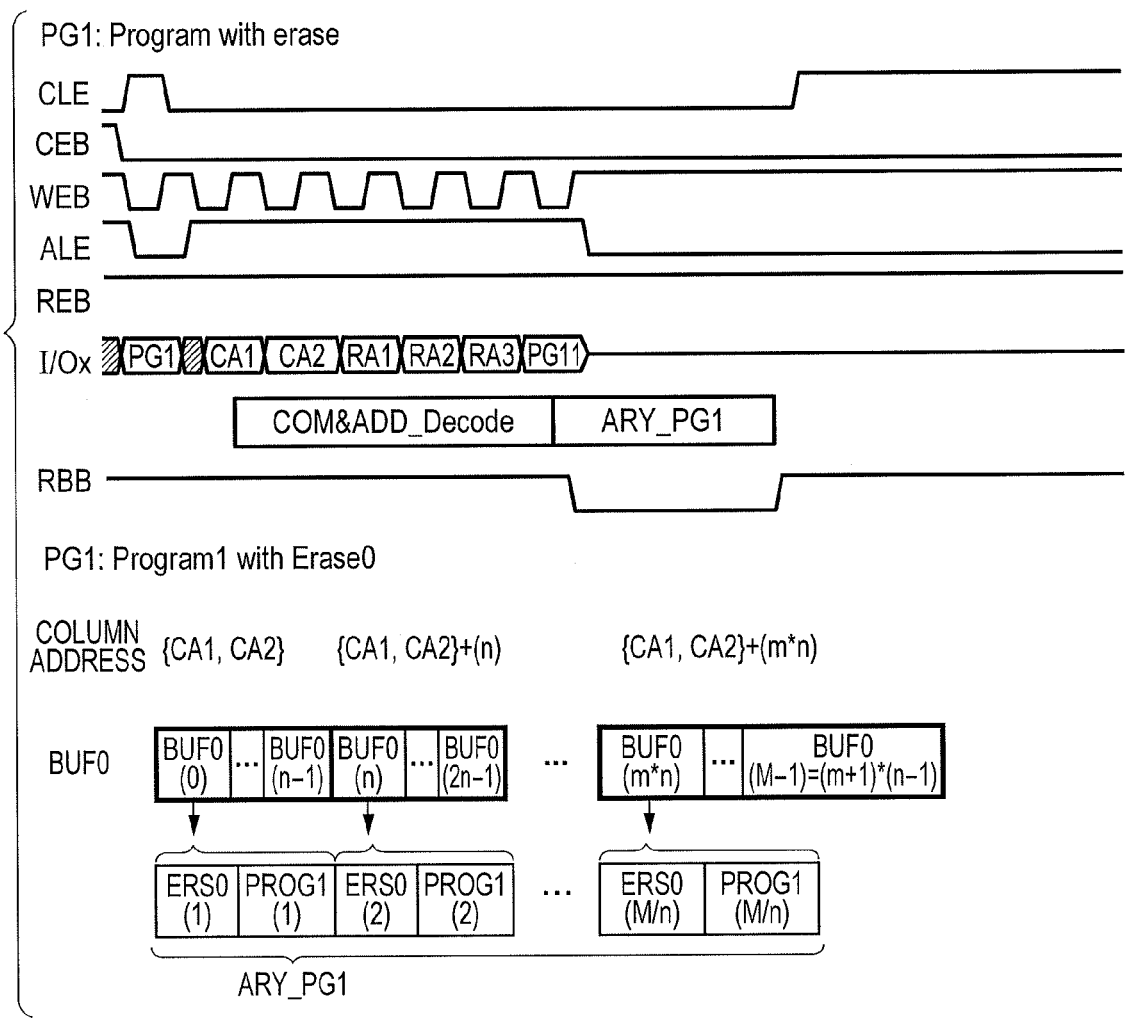
FIG. 6A and FIG. 6B are views showing operation waveforms of a phase change memory device and internal operation (PG1, PG2) in the embodiment of the present invention.
Figure 6B:
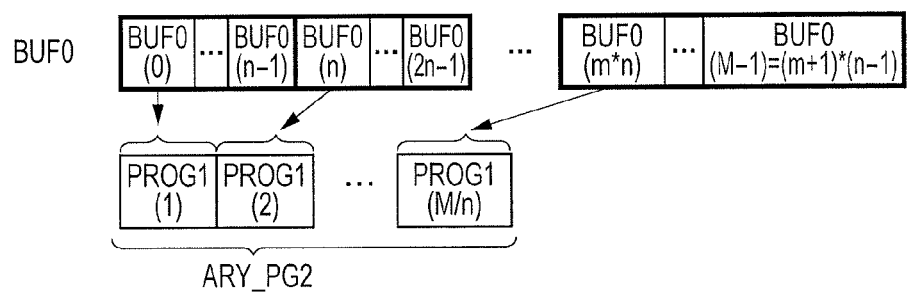

FIGS. 6A and 6B show an example of write operation when M bite data held in the data buffer DBUF0 of the non-volatile memory device NVM1x (x=0 to 4) is written into the memory cell.

At first, write operation in FIG. 6A is to be described.

The command latch enable signal CLE at a low level is driven into high level and the chip enable signal CEB and the address latch enable signal ALE at high level are driven to a low level. Then, when the write command PG1 is inputted by way of the input/output line I/Ox (x=0 to 7), the data buffer write command PG1 is put by the rising edge of the write enable signal WEB into the address command interface circuit ADCMDIF and decoded. Further, the command PG1 also includes information for designating data buffer DBUF0 or DBUF1 and data buffer DBUF0 is designated in the example of FIG. 6A.

Then, the command latch enable signal CLE at the high level is driven to a low level, and the address latch enable signal ALE at the low level is driven to a high level respectively. The column address is inputted in two steps (CA1, CA2) and the row address is inputted in three steps (RA1, RA2, RA3) orderly. The addresses are put into the address command interface circuit ADCMDIF by the rising edge of the write enable signal WEB and decoded.

As a result of decoding the address (CA1, CA2, RA1, RA2, RA3) and the command PG1 by the address command interface circuit ADCMDIF, when it is informed to the control circuit CONTLOGIC that this is the write instruction from the data buffer DBUF0 to the memory cell cel the control circuit CONTLOGIC activates the data buffer DBUF0 of the memory bank BK0.

Then, when the second command PG11 is inputted by way of the input/output line I/Ox (x=0 to 7), the second command PGI1 is put into the address command interface circuit ADCMDIF by the rising edge of the write enable signal WEB and decoded.

Then, in the same manner as in the write operation to the memory cell shown in FIG. 4, data is read on every n byte from the data buffer DBUF0 of the memory bank BK0 and the memory cell is driven to a high resistance state (erase: ERS0), it is driven to a low resistance state (program: PROG1).

When the M byte data stored in the data buffer DBUF0 of the memory bank BK0 is written, erase (ERS0) and program (PROG1) are performed by M/n times.

Further, when the data buffer DBUF1 is designated by the write command PG1, operation of writing an M byte data to the memory cell held in the data buffer DBUF1 also occurs.

Then, write operation not requiring erase operation in FIG. 6B is to be described.

When the first command is PG2 and the second command is PG21 in the write operation not requiring the erase operation, the command PG2 is inputted instead of the command PG1 in FIG. 6A and the command PG21 is inputted instead of the command PG11.

Further, the command PG2 also includes information for designating the data buffer DBUF0 or DBUF1 and data buffer DBUF0 is designated in the example of FIG. 6B.

When the second command PG21 is inputted by way of the input/output line I/Ox (x=0 to 7) and the second command PG21 is put into the address command interface circuit ADCMDIF by the rising edge of the write enable signal WEB, data is read on every n byte from the data buffer DBUF0 of the memory bank BK0 to attain a low resistance state (program: PROG1).

When M byte data stored in the data buffer DBUF0 of the memory bank BK0 is written, the program (PROG1) is executed by M/n times.

Further, when the data buffer DBUF1 is designated by the command PG2, the same operation of writing the M byte data held in the data buffer DBUF1 to the memory cell occurs.

When the sector to be written is in a previously erased state, erase operation is not necessary by utilizing the commands (PG2 and PG21) and write time can be shortened.

<<Erase Operation>>

Figure 7A:
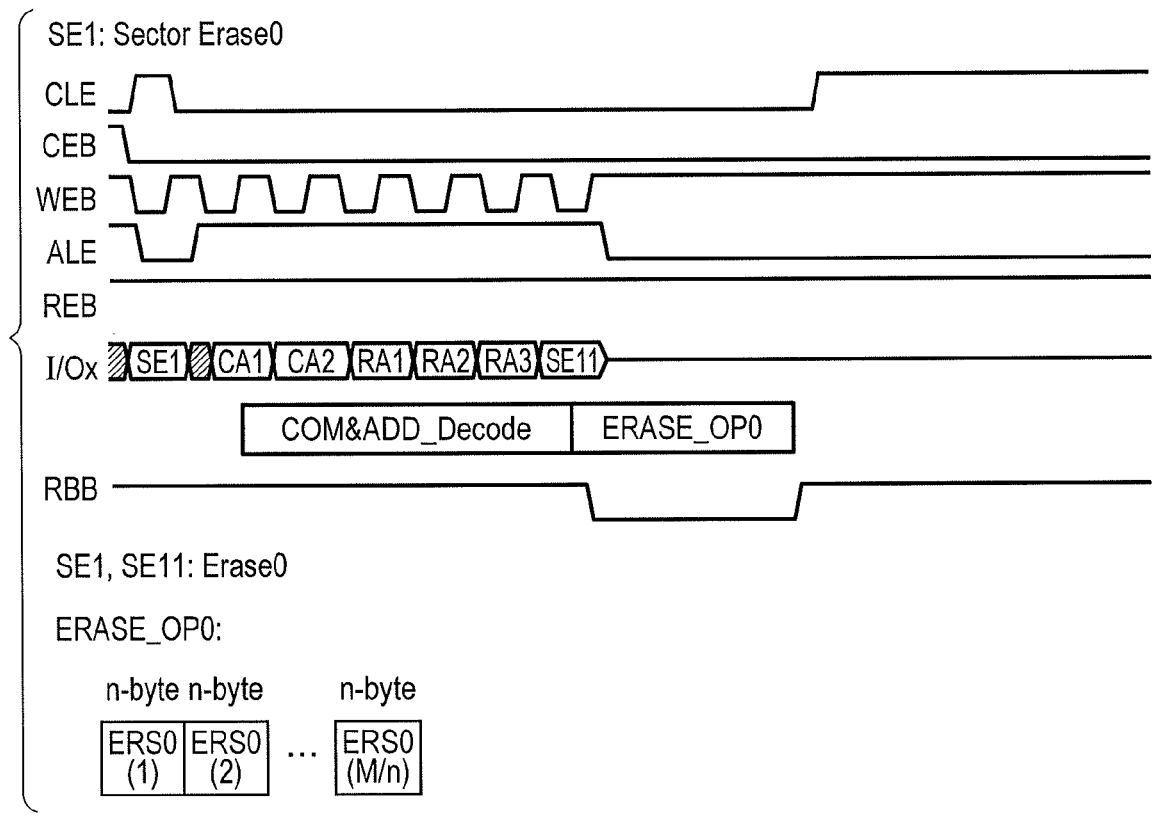
FIG. 7A to C are views showing operation waveforms and an example of internal operation (SE1, SE11, BE1, BE11, CE1, CE11) of a phase change memory device.
Figure 7B:
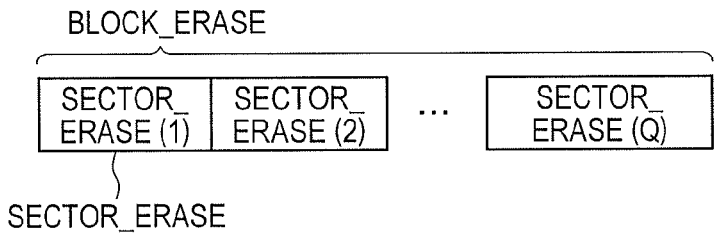
Figure 7C:
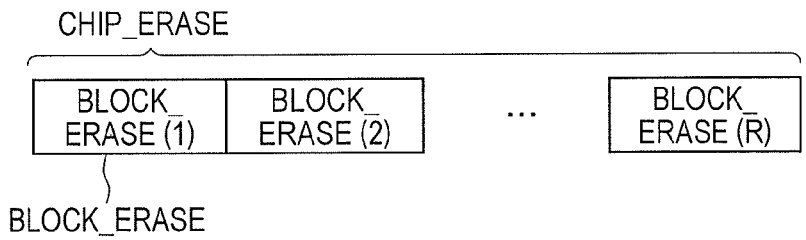

FIG. 7A to FIG. 7C show erase operation of the non-volatile memory device NVM1x (x=0 to 4). FIG. 7A shows a sector erase operation, FIG. 7B shows a block erase operation, and FIG. 7C shows a chip erase operation each for an example.

At first, the sector erase operation in FIG. 7A is to be described.

The command latch enable signal CLE at a low level is driven to a high level and the chip enable signal CEB and the address latch enable signal ALE at a high level are driven to a low level. Then, when the first sector erase command SE1 is inputted by way of the input/output line I/Ox (x=0 to 7), the first sector erase command SE1 is put into the address command interface circuit ADCMDIF by the rising edge of the write enable signal WEB and decoded.

Then, the command latch enable signal CLE at the high level is driven to a low level, and the address latch enable signal ALE at the low level is driven to a high level respectively. The column address is inputted in two steps (CA1, CA2) and the row address is inputted in three steps (RA1, RA2, RA3) orderly. The addresses are put into the address command interface circuit ADCMDIF by the rising edge of the write enable signal WEB and decoded.

Then, when the second sector erase command SE11 is inputted by way of the input/output line I/Ox (x=0 to 7), the second sector erase command SE11 is put into the address command interface circuit ADCMDIF by the rising edge of the write enable signal WEB and decoded.

Then, in the same manner as in the erase operation to the memory cell shown in FIG. 4, the memory cell cel connected to the selected word line WL is selected by the bit line BL on every n byte to attain a high resistance state (erase: ERS0).

Assuming the data size for 1 sector as M bytes, the erase operation (ERS0) is performed by M/n times.

Then, the block erase operation in FIG. 7B is to be described.

In the block erase operation, when the first command is BE1 and the second command is BE11, the command BE1 is inputted instead of the command SE1 and the command BE11 is inputted instead of the command SE11 in FIG. 7A.

When the second command BE11 is inputted by way of the input/output line I/Ox (x=0 to 7), the second command BE11 is put into the address command interface circuit ADCMDIF by the rising edge of the write enable signal WEB.

Then, when the one block comprises sectors by the number of Q, the sector erase operation shown in FIG. 7A is performed by Q times.

In the block erase operation, since multiple sectors can be erased continuously by one block erase command, high speed erasure is attained.

Then, a chip erase operation in FIG. 7C is to be described.

When first command is CE1 and the second command is CE11 in the chip erase operation, the command CE1 is inputted instead of the command SE1 and the command SE11 is inputted instead of the command CE11 in FIG. 7A.

Then, when the second command CE11 is inputted by way of the input/output line I/Ox (x=0 to 7), the second command CE11 is put into the address command interface circuit ADCMDIF by the rising edge of the write enable signal WEB.

Then, when one chip comprises blocks by the number of R, the block erase operation shown in FIG. 7B is performed by R times.

In the chip erase operation, since multiple blocks can be erased continuously by one chip erase command, high speed erase can be attained.

<<Read Operation for 1 Sector Data>>

Figure 8:
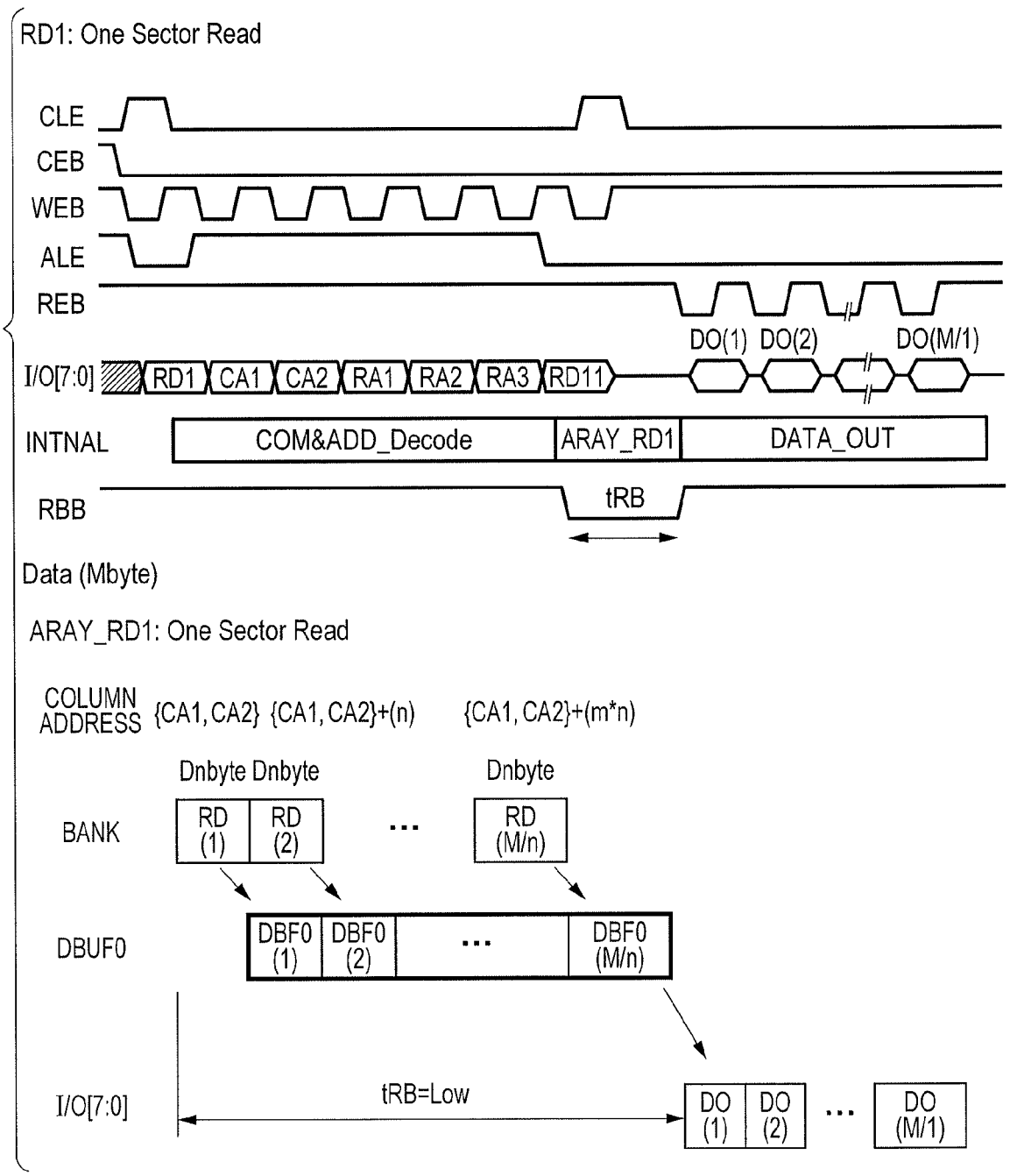
FIG. 8 shows operation waveforms and an example of internal operation (RD1, ARAY_RD1) of a phase change memory in an embodiment of the invention.

FIG. 8 shows an example of read operation when a memory control device NVCTx (x=0 to 4) reads data for 1 sector (M byte) from a non-volatile memory device NVM1x (x=0 to 4) by way of the data buffer DBUF0.

The command latch enable signal CLE at a low level is driven to a high level and the chip enable signal CEB and the address latch enable signal ALE at high level are driven to a low level.

Then, when a sector data read command RD1 is inputted by way of the input/output line I/Ox (x=0 to 7), the first sector read command RD1 is put into the address command interface circuit ADCMDIF by the rising edge of the write image signal WEB and decoded.

Then, the command latch enable signal CLE at the high level is driven to a low level and the address latch enable signal ALE at the low level is driven to a high level respectively, and column address is orderly inputted in two steps (CA1, CA2) and the row address is inputted orderly in three step (RA1, RA2, RA3). The addresses are put by the rising edge of the write enable signal WEB into the address command interface circuit ADCMDIF and decoded.

Then, the command latch enable signal CLE at the low level is driven to a high level and the chip enable signal CED and the address latch signal ALE at the high level are driven to a low level.

Then, when the second sector data read command RD11 is inputted by way of the input/output line I/Ox (x=0 to 7), the second sector read command RD11 is put by the rising edge of the write enable signal WEB into the address command interface circuit ADCMDIF and decoded.

The commands RD1 and RD11 also contain information designating the data buffer DBUF0 or DBUF1, and the data buffer DBUF0 is designated in the example of FIG. 8.

As a result of decoding the address command RD1 and the command RD11 by the address command interface circuit ADCMDIF, when it is transferred to the control circuit CONTLOGIC that this is the read instruction to the memory bank BK0, the control circuit CONTLOGIC activates the memory bank BK0 for reading the data from the memory bank BK0.

The row address (RA1, RA2, RA3) and the column address (CA1, CA2) inputted to the address command interface circuit ADCMDIF are transferred through the control circuit CONTLOGIC respectively to the activated row address latch circuit RADLT of the memory bank BK0, and transferred to the column address latch circuit CADLT.

The row address (RA1, RA2, RA3) is transferred from the row address latch circuit RADLT to the row decoder ROWDEC, and a word line WLi corresponding to the row address (RA1, RA2, RA3) is selected by the row decoder ROWDEC.

Then, the column address (CA1, CA2) is transferred from the column address circuit CADLT to the column decoder COLDEC and decoded.

The decoding result from the column decoder COLDEC is inputted to the bit line selection circuits BSW0-m of each of the memory array (ARY0-m), one bit line BLi is selected on every memory array, and is connected by way of the data line DT0-m to the sense amplifier SA0-m.

Thus, since one bit memory cell cel is selected on every memory array (ARY0-m), memory cells cel for (m+1) bits in total (from 0th bit to mth bit) are selected simultaneously among one memory bank.

A current is flown from the memory cell cel selected on every memory arrays (from 0th bit to mth bit) by way of the data line to the sense amplifier SA0-n disposed to the respective memory arrays, the voltage is measured in this case and compared with a reference voltage thereby detecting data Dnbyte for data m+1 bit stored in the memory cells cel.

That is, data Dnbyte first n bites (=(m+1)/8) selected by the column address (CA1, CA2) are detected simultaneously from the memory cells cel.

For example, when the memory cell cel at the intersection between the word line WLn and the bit line BL0 of the memory array ARY0 stores information "1" and at a low resistance, the bit line BL0 and the data line DT0 are charged and the voltage is transmitted to the sense amplifier SA and data "1" is detected.

On the other hand, when the memory cell cel on the intersection between the word line WLn and the bit line BL0 of the memory array ARY1 stores information "0" and is at a high resistance, the bit line BL0 and the data line DT1 are maintained substantially at a ground voltage VSS, and the voltage is transmitted to the sense amplifier SA and the data "0" is detected.

The data Dnbyte for the detected first n bytes (=(m+1)/8) is transferred by way of the data selection circuit DSW1 to the data buffer DBUF0 designated by the commands RD1 and RD11.

The next n byte data is selected by the column address {{CA1, CA2}+(n)} and transferred to the data buffer DBUF0.

As described above, the n byte data selected by the column address with addition of n multiple from the memory cell cel to the starting column address {CA1, CA2} are transferred orderly to the data buffer DBUF0.

In the sector data read operation, assuming the sector size as M bytes, data transfer from the memory array ARY to the data buffer DBUF0 occurs by M/n times.

The ready busy signal RBB at a high level is driven to a low level during transfer the data for sector size from the memory cell cel to the data buffer DBUF0.

At the instance the data transfer is completed, the ready busy signal RBB at the low level is driven to a high level.

When the number of the input/output signal IO is 8 bits (1 byte), the data for the sector size (M byte) stored in the data buffer DBUF0 are outputted orderly in synchronization with the falling edge of the read enable signal REB from the output signal IO in the order of DO(1) to DO(M/1).

For example, when the data size for 1 sector is 2048 bytes, the data size for the memory cell cel selected simultaneously is 16 bytes (128 bits), and the number of signals of the input/output signal IO is 8 bits (1 byte), data are transferred from the memory cell cel to the data buffer DBUF0 by 128 times in total (=2048/16), and the data is outputted from the data buffer DBUF0 by way of the input/output signal IO by 2048 times (=2048/1).

Further, when the data buffer DBUF1 is designated by the commands RD1 and RD11, data for one sector (M byte) is read from the memory array of the non-volatile memory device NVM1x (x=0 to 4) by way of the data buffer DBUF1.

<<Read Operation Designating Data Size>>

Figure 9:
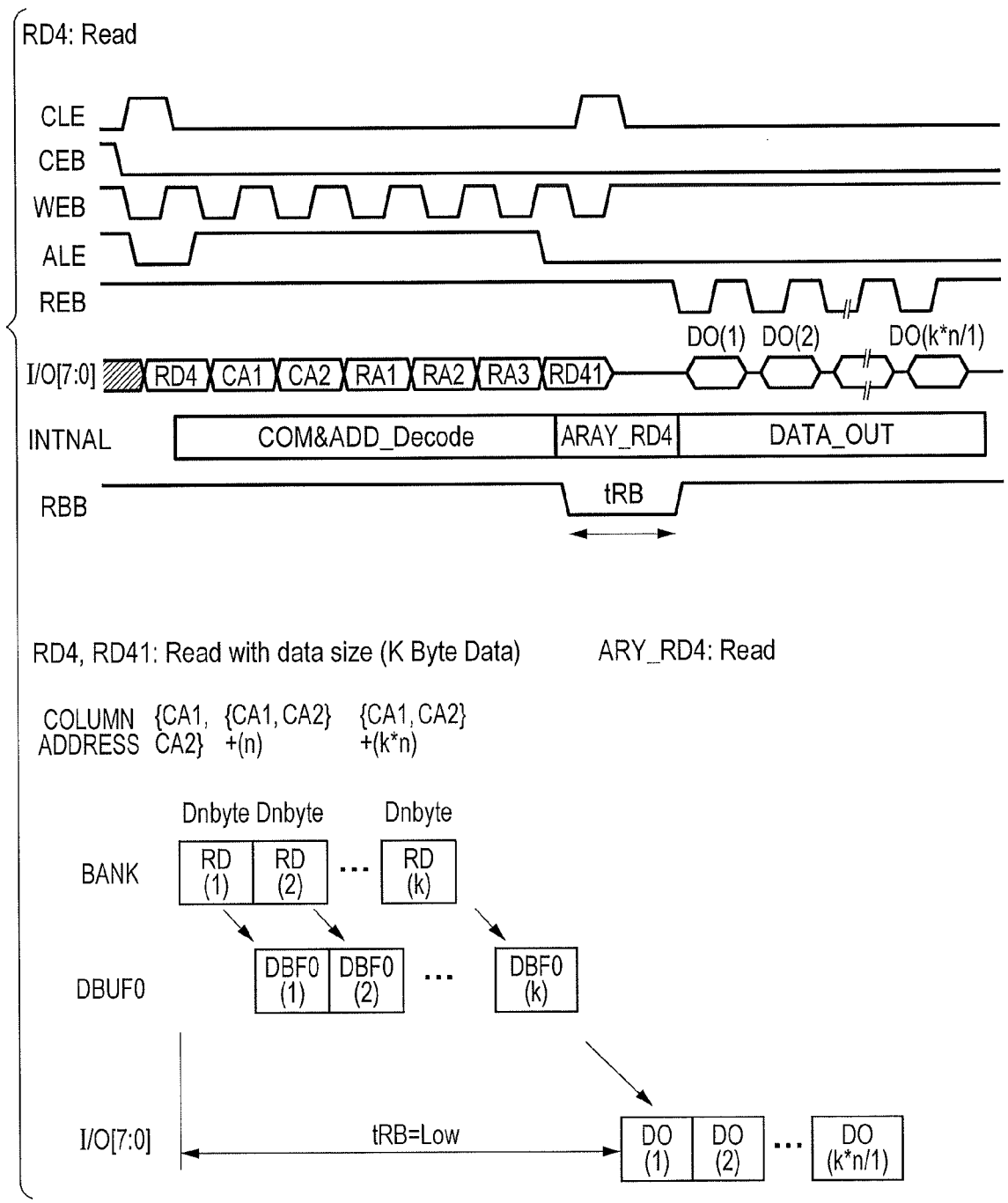
FIG. 9 shows waveforms and an example of internal operation (RD4, RD41, ARY_RD4) of a phase change memory in an embodiment of the invention.

FIG. 9 shows an example of read operation when data for the designated data size is read from the non-volatile memory device NVM1x (x=0 to 4) by way of the data buffer DBUF0.

The operation timing for inputting the command and the address is identical with that in FIG. 8.

When the first read command is RD4 and the second read command is RD41 for reading the data while designating the data size, the command RD4 is inputted instead of the command RD1 and the command RD41 is inputted instead of the command RD11 in FIG. 8.

The commands RD4 and RD41 also include information for designating the data size and the data buffer DBUF0 or DBUF1 in addition to the read instruction. In the example of FIG. 9, the data size is designated as k×n byte and the data buffer DBUF0 is designated.

Further, the transfer operation from the memory cell cel to the data buffer DBUF0 and the read operation from the input/output signal IO are performed in the same manner as in FIG. 8.

The data Dnbyte for first n byte is selected by the column address {CA1, CA2} and transferred to the data buffer DBUF0.

The second n byte data is selected by the column address {{CA1, CA2}+(n)} and transferred to the data buffer DBUF0.

The n byte data selected by the column address with addition of n multiple orderly from the memory cell cel to the starting column address {CA1, CA2} are transferred to the data buffer DBUF0 orderly.

When the designated data size is k×n byte, data transfer occurs from the memory array ARY to the data buffer DBUF0 by k times.

When the number of signals of the input/output signal IO is 8 bits (1 byte), the k×n byte data stored in the data buffer DBUF0 is outputted in synchronization with the falling edge of the read enable signal REB from the input/output signal IO in the order of DO(1) to DO(k×n/1).

For example, when the designated data size is 512 bytes, the data size of the simultaneously selected memory cells cel is 16 bytes, and the number of signals of the input/output signal IO is 8 bits (1 byte), data are transferred from the memory cell cel to the data buffer DBUF0 by 32 times (=512/16) in total, and data are outputted from the data buffer DBUF0 by way of the input/output signal IO by 512 times.

Further, when the data buffer DBUF1 is designated by the commands RD4 and RD41, data for the designated data size (k×n bytes) is read from the memory array of the non-volatile memory device NVM1x (x=0 to 4) by way of the data buffer DBUF1.

As described above, in the read operation while designating the optional data size, since only the data for the necessary size can be read efficiently, high speed read operation can be attained.

<<Load Operation for 1 Sector Data>>

Figure 10:
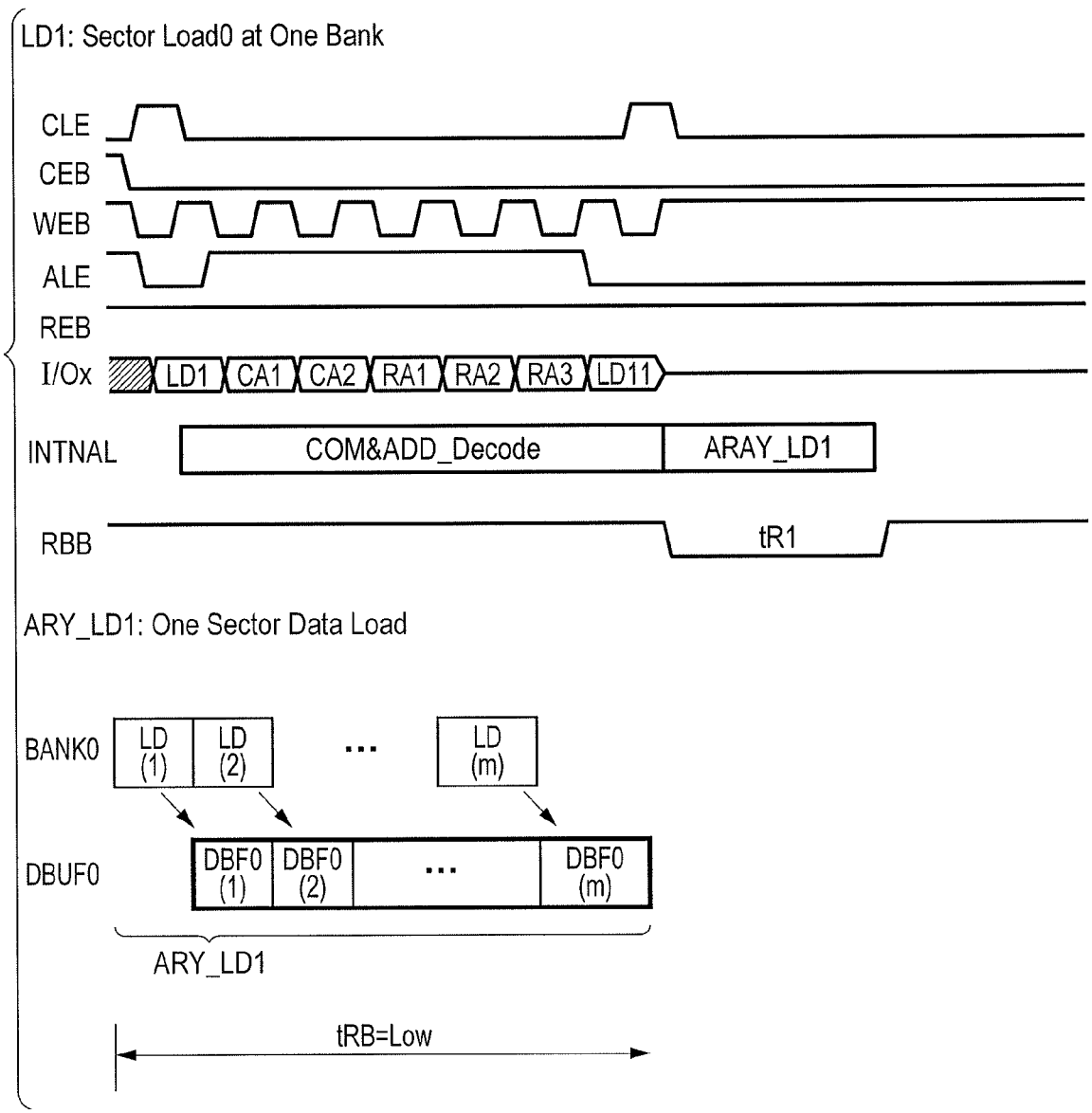
FIG. 10 shows operation waveforms and an example of internal operation (LD1, ARY_LD1) of a phase change memory device in an embodiment of the invention.

FIG. 10 shows an example of load operation of transferring data for one sector (M byte) in the memory array ARY of the non-volatile memory device NVM1x (x=0 to 4) to the data buffer DBUF0.

The operation timing for inputting the command and the address is identical with that in FIG. 8.

When the first load command is LD1 and the second load command is LD11 for transferring the 1 sector (M byte) data in the memory array ARY to the data buffer, the command LD1 is inputted instead of the command RD1 and the command LD11 is inputted instead of the command RD11 in FIG. 8. Further, the commands LD1 and LD11 also designate the data buffer DBUF0.

By changing designation of the data buffer to the data buffer DBUF1, the 1 sector (M byte) data in the memory array ARY is transferred to the data buffer DBUF1.

The load operation for 1 sector data is identical with the transfer operation from the memory cell cel to the data buffer DBRF0 shown in FIG. 8.

Assuming the sector size as M bytes and the data size in which the memory cell cel for n byte selected simultaneously to the data buffer DBUF0 as n byte, data are transferred from the memory array ARY to the data buffer DBUF0 by m times (=M/n).

The ready busy signal RBB at a high level is driven to a low level during transfer of 1 sector size data from the memory cell cel to the data buffer DBUF0. When the data transfer is completed, the ready busy signal RBB signal at the low level is driven to the high level at the instance the data transfer is completed.

<<Multi Sector Data Load Operation>>

Figure 11:
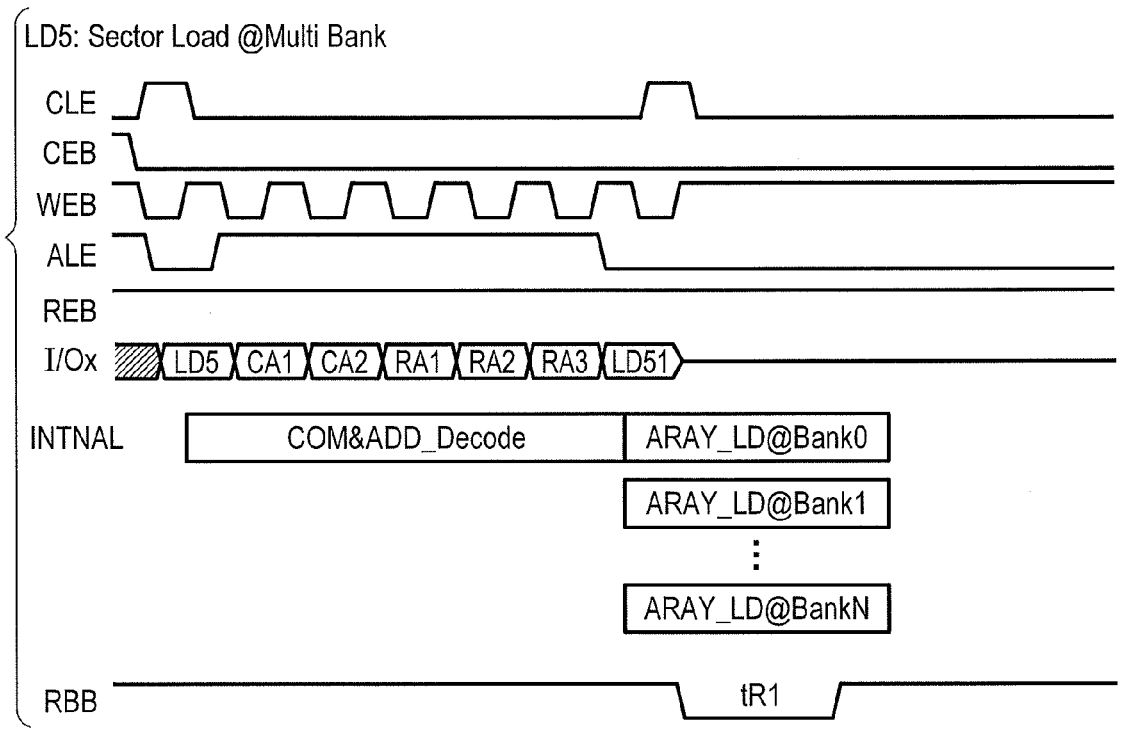
FIG. 11 shows operation waveforms and an example of internal operation (LD5) of a phase change memory device in an embodiment of the invention.

FIG. 11 shows an example of load operation of simultaneously transferring the 1 sector (M byte) data in the memory array ARY of the entire bank to the data buffer DBUF0 of each of the banks in the non-volatile memory device NVM1x (x=0 to 4).

The operation timing for inputting the command and the address is identical with that in FIG. 10.

When the first load command is LD5 and the second load command is LD51 for transferring the 1 sector (M byte) data in the memory array ARY in each of the banks to the data buffer, the command LD5 is inputted instead of the command LD1 and the command LD51 is inputted instead of the command LD11 in FIG. 10. Further, the command LD5 and LD51 also designate the data buffer DBUF0.

By changing the designation of the data buffer to the data buffer DBUF1, the 1 sector (M byte) data in the memory array ARY of each of the banks are transferred to the data buffer DBUF1.

The load operation for the multi sector data is an operation of simultaneously executing the load operation of the first sector data for all of the bank shown in FIG. 10.

By the load operation of the multi sector data, since the amount of the data transferred at once from the memory array ARY to the data buffer DBUF0 is increased by 8 times (8 banks), the data transfer speed can be increased.

<<Read Operation from the Data Buffer>>

Figure 12:
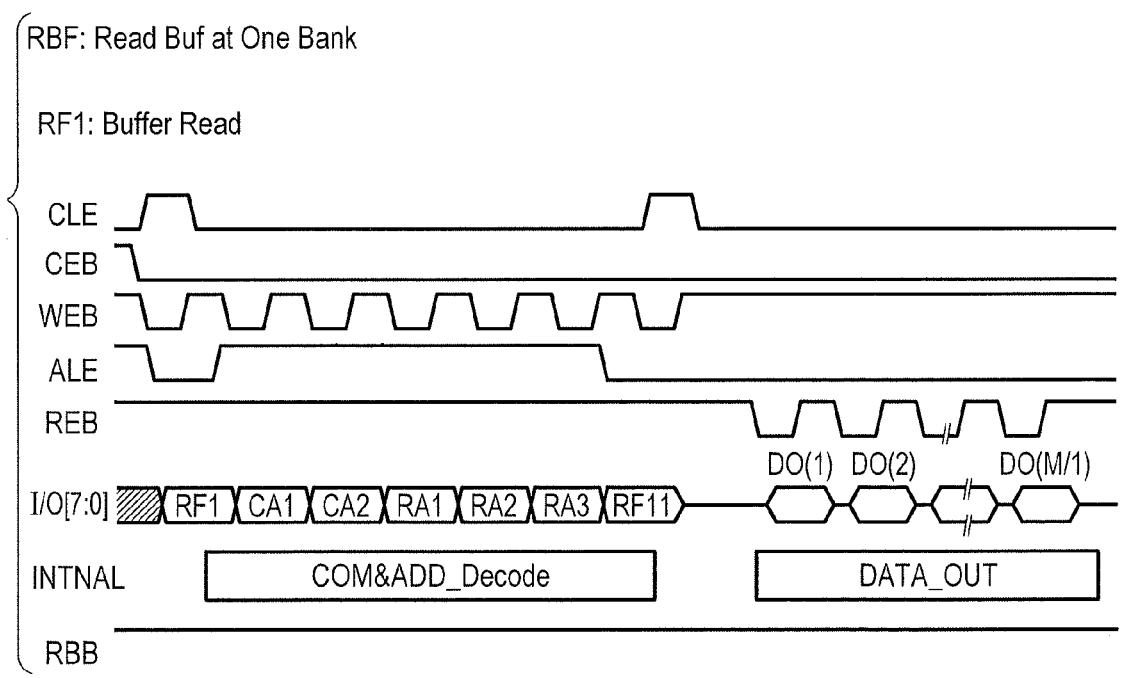
FIG. 12 shows operation waveforms and an example of internal operation (RBF) of a phase change memory device in an embodiment of the invention.

FIG. 12 shows an example of read operation upon reading the M byte data from the data buffer DBUF0 of the non-volatile memory device NVM1x (x=0 to 4).

The command latch enable signal CLE at a low level is driven to a high level and the chip enable signal CEB and the address latch enable signal ALE at a high level are driven to a low level.

Then, when the first data buffer read command RF1 is inputted by way of the input/output line I/Ox (x=0 to 7), the first data buffer read command RF1 is put into the address command interface circuit ADCMDIF by the rising edge of the write enable signal WEB and decoded.

Then, the command latch enable signal CLE at the high level is driven to a low level and the address latch enable signal ALE at the low level is driven to a high level respectively, and a bank address is inputted once (BA1). The bank address is put into the address command interface circuit ADCMDIF by the rising edge of the write enable signal WEB and decoded.

Then, the command latch enable signal CLE at the low level is driven to a high level and the chip enable signal CEB and the address latch enable signal ALE at the high level are driven to a low level.

Then, when the second data buffer read command RF11 is inputted by way of the input/output line I/Ox (x=0 to 7), the second data buffer read command RF11 is put into the address command interface circuit ADCMDIF by the rising edge of the write enable signal WEB and decoded.

Further, the commands RF1 and RF11 also contain information for designating the data buffer DBUF0. By changing the information for designating the data buffer to that for the data buffer DBUF1, data can be read from the data buffer DBUF1.

As a result of decoding the address command RF1 and the command RF11 by the address command interface circuit ADCMDIF, when it is transferred to the control circuit CONTLOGIC that this is the read instruction to the data buffer DBUF0 of the memory bank BK0, the control circuit CONTLOGIC activates the data buffer DBUF0 for reading the data from the data buffer DBUF0 of the memory bank BK0.

Then, when the number of the input/output signals IO is 8 bits (1 byte), the M byte data stored in the data buffer DBUF0 of the memory bank BK0 is outputted in synchronization with the falling edge of the read enable signal REB from the input/output signal IO in the order of DO(1) to DO(M/1).

When only the NE byte data is read from the data buffer DBUF0 of the memory bank BK0 through the signal of input/ output line IO, the number of falling edges of the read enable signal REB may be set to NE times.

As described above, by changing the read enable signal REB from the high level to the low level by required times, only the necessary data can be outputted.

<<Parallel Simultaneous Operation in One Identical Bank of Memory Device (NVM10 to NVM13)>>

Figure 18A:
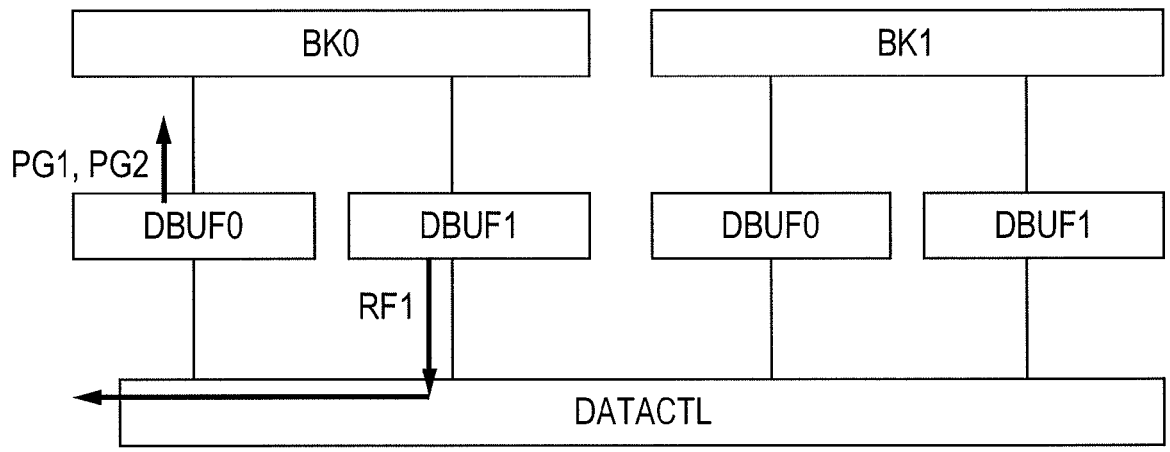
FIG. 18A and FIG. 18B shows examples of an internal operation of a phase change memory device.
Figure 18B:
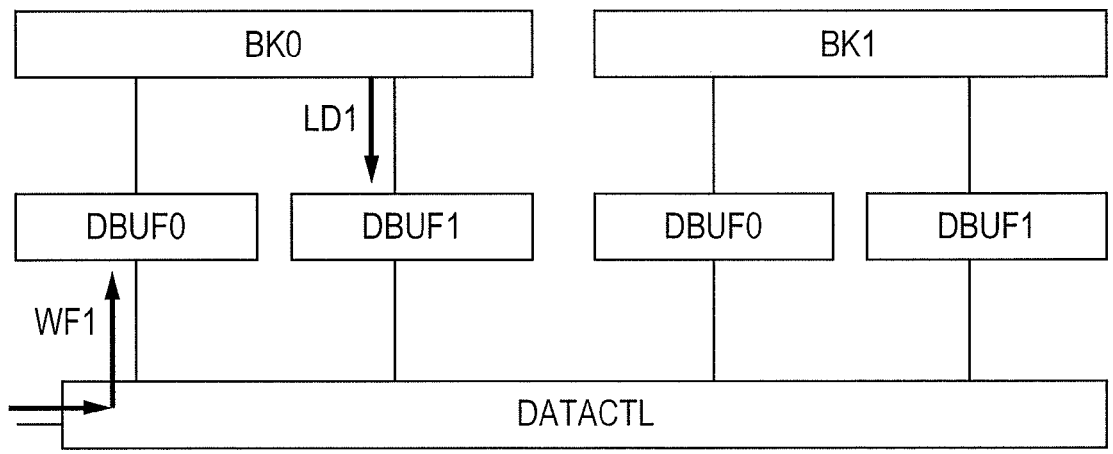

FIGS. 18A and 18B show an operation capable of parallel and simultaneous operation in one identical bank of the memory device (NVM10 to NVM13). Further, FIGS. 18A, 18B show the memory device described in FIG. 2 in a simplified form.

As shown in FIG. 18A, since the data buffers DBUF0 and DBUF1 are independently connected to the memory bank 0 (BK0) and the data control circuit DATACTL respectively, when data Data0 and Data1 are already stored in the data buffer DBUF0 and DBUF1 in the memory bank 0 (BK0), the program operation (PG1, PG2) of the data Data0 stored in the data buffer DBUF0, and the read operation (RF1) of the data Data1 stored in the other data buffer DBUF1 can be executed simultaneously. Further, it is apparent that the program operation (PG1, PG2) of the data Data1 stored in the data buffer DBUF1, and the read operation (RF1) of the data Data0 stored in the other data buffer DBUF0 can also be executed simultaneously.

As shown in FIG. 18B, since the data buffers DBUF0 and DBUF1 are connected independently to the memory bank 0 (BK0) and the data control circuit DATACTL respectively, the write operation (WF1) to the data buffer DBUF0 and the read operation (RD1) from the memory bank (BK0) to the other data buffer DBUF1 can be executed simultaneously. It will be apparent that the write operation (WF1) to the data buffer DBUF1 and the read operation (LD1) from the memory bank 0 (BK0) to the other data buffer DBUF0 can also be executed simultaneously.

As has been described above, in the memory devices (NVM10 to NVM13), since simultaneous operations in one identical memory bank are possible, the write and the erase operations can be conducted at a high speed.

<<Parallel and Simultaneous Operation of Memory Device (NVM10 to NVM13) Between Different Banks>>

FIG. 19A to FIG. 19C and FIG. 20A to FIG. 20C show operations capable of parallel and simultaneous operation between different banks of memory devices (NVM10 to NVM13). Further, FIG. 19A to FIG. 19C and FIG. 20A to FIG. 20C show the memory device described in FIG. 2 in the simplified form.

As shown in FIG. 19A FIG. 19C and FIG. 20A to FIG. 20C, the memory devices (NVM10 to NVM13) have data buffers DBUF0 and DBUF1 on every memory bank, and each of the data buffers is connected independently to each of the memory banks and the data control circuit DATACTL.

Figure 19A:
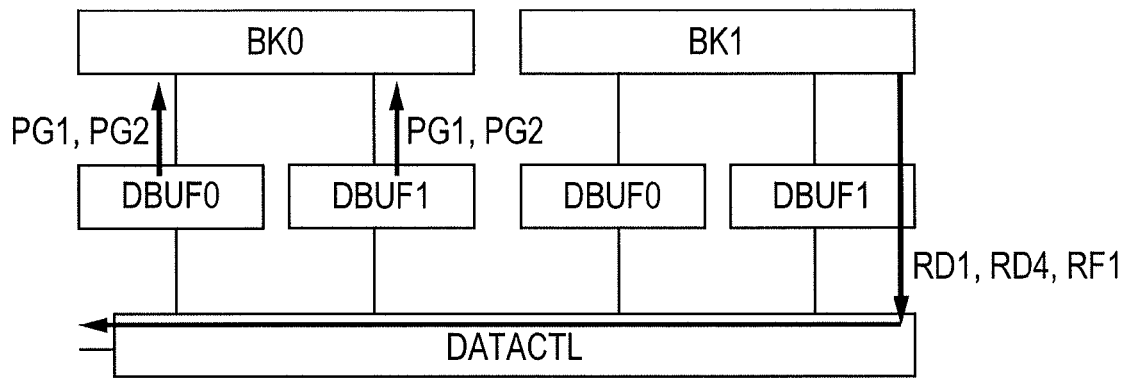
FIG. 19A to FIG. 19c shows examples of an internal operation of a phase change memory device.

Accordingly, as shown in FIG. 19A, the program operation (PG1, PG2) for the data stored in the data buffers (DBUF0 and DBUF1) of the memory bank 0 (BK0) to the memory bank 0 (BK0), the read operation (RD1, RD4) from the memory bank 1 (BK1) different from the memory bank 0, and the read operation (RF1) for the data stored in the data buffers (DBUF1 (DBUF0)) of the memory bank (BK1) can be executed simultaneously.

Figure 19B:
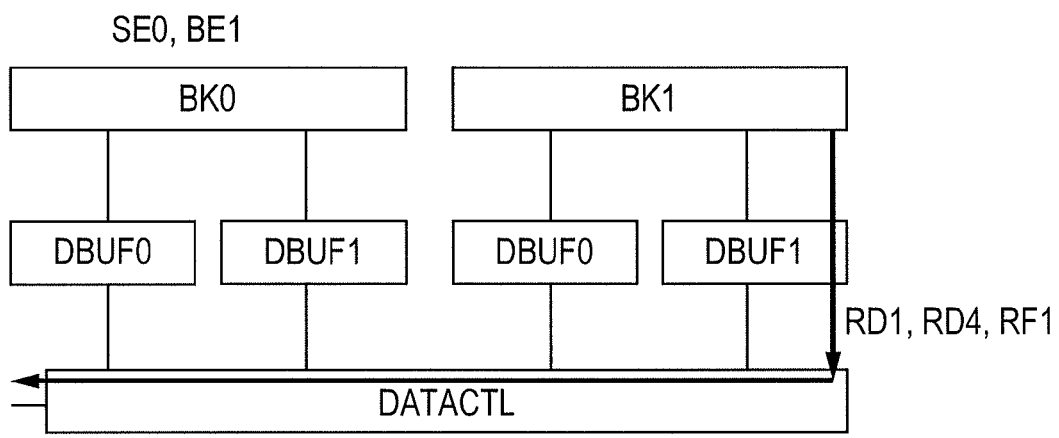

Further, as shown in FIG. 19B, the erase operation (SE0, BE1) in the memory bank 0 (BK0), the read operation (RD1, RD4) from the memory bank 1 (BK1) different from the memory bank 0, and the read operation (RF1) for the data stored in the data buffers (DBUF1, DBUF0) of the memory bank 1 (BK1) can be executed simultaneously.

Figure 19C:
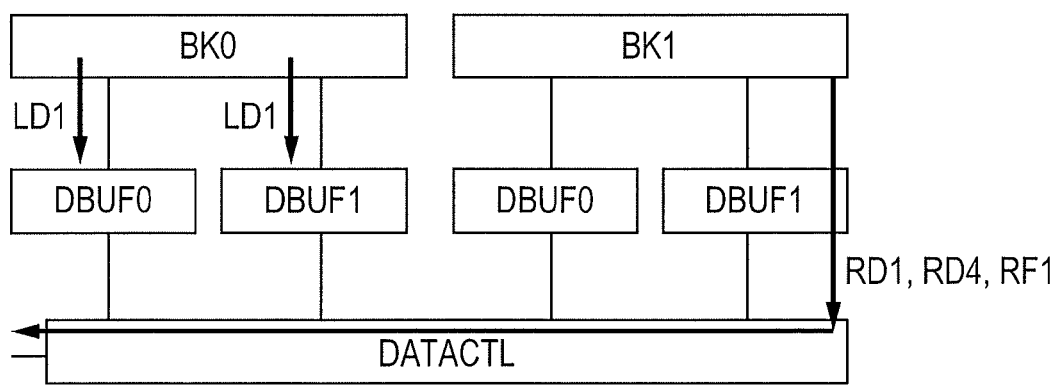

As shown in FIG. 19C, the read operation (LD1) from the memory bank 0 (BK0) to the data buffers (DBUF0 and DBUF1) of the memory bank 0 (BK0), the read operation (RD1, RD4) from the memory bank 1 (BK1) different from the memory bank 0, and the read operation (RF1) for the data stored in the data buffers (DBUF1, (DBUF0)) of the memory bank 1 (BK1) can be executed simultaneously.

Figure 20A:
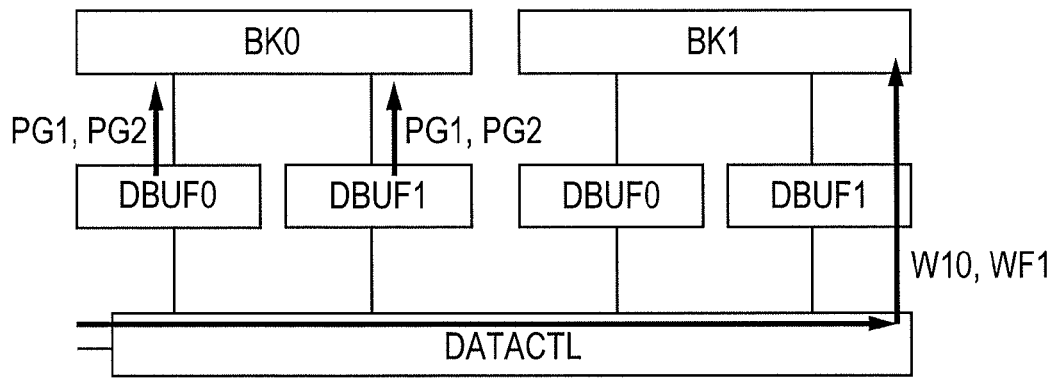
FIG. 20A to FIG. 20C shows examples of an internal operation of a phase change memory device

Further, as shown in FIG. 20A, the program operation (PG1, PG2) for the data stored in the data buffers (DBUF0 and DBUF1) of the memory bank 0 (BK0) to the memory bank 0 (BK0), the write operation (W10) to the memory bank 1 (BK1) different from the memory bank 0, and write operation (WF1) for the data stored in the data buffers (DBUF1 (DBUF0)) of the memory bank 1 (BK1) to the memory bank 1 (BK1) can be executed simultaneously.

Figure 20B:
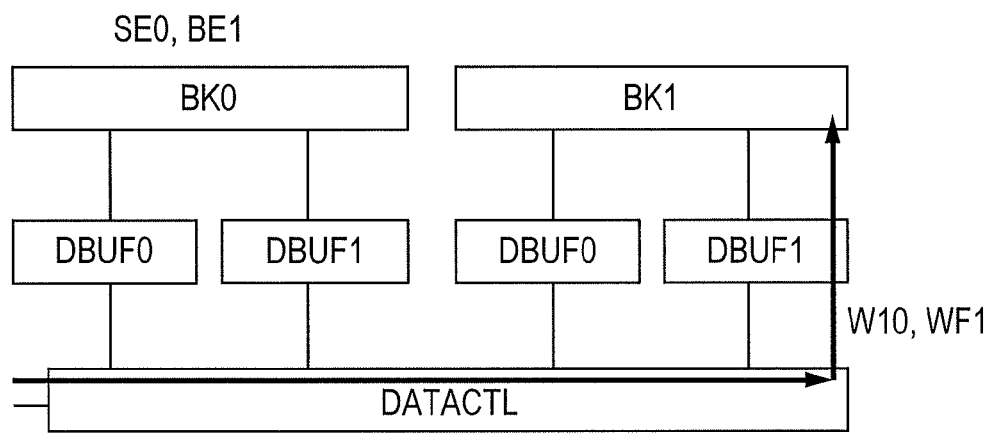

Further, as shown in FIG. 20B, the erase operation (SE0, BE1 in the memory bank 0 (BK0), the write operation (W10) to the memory bank 1 (BK1) different from the memory bank 0, and the write operation (WF1) for the data stored in the data buffer (DBUF1 (DBUF0)) of the memory bank 1 (BK1) to the memory bank 1 (BK1) can be executed simultaneously.

Figure 20C:
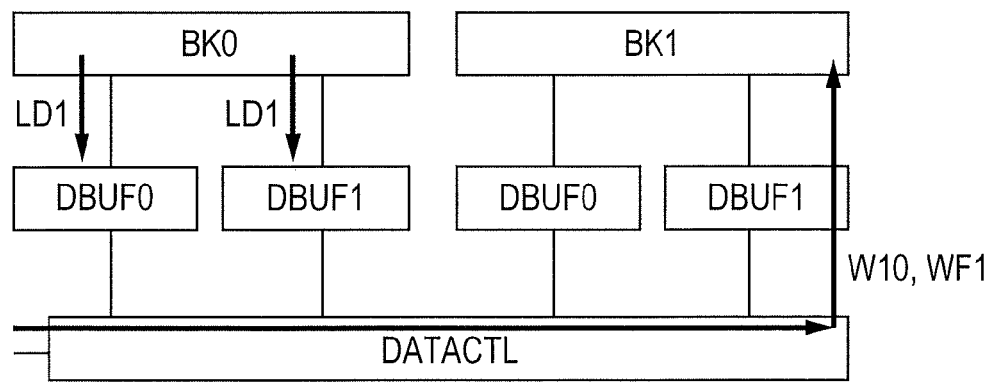

Further, as shown in FIG. 20C, the read operation (LD1) from the memory bank 0 (BK0) to the data buffers (DBUF0 and DBUF1) of the memory bank 0 (BK0), the write operation (W10) to the memory bank 1 (BK1) different from the memory bank 0, and the write operation (WF1) for the data stored in the data buffer (DBUF1 (DBUF0)) of the memory bank 1 (BK1) to the memory bank 1 (BK1) can be executed simultaneously.

As has been described above, in the memory devices (NVM10 to NVM13), since simultaneous operation is enabled between different memory banks, read, write, and erase operations can be conducted at a high speed.

<<Write Operation for Memory Module NVMSTR>>

FIGS. 16A to 16E show the operation of the control circuit STRCT0 and the memory devices NVM10 to NVM13 when write demands of various data sizes are inputted from the information processing unit CPU_CHIP to the memory module NVMSTR.

FIG. 16A shows an operation when a 512 byte data is inputted from the information processing unit CPU_CHIP to the memory devices NVM10 to NVM13 with the logical address LAD Hex03FFFFF0 address being as the starting address.

When a write demand WRQ05 containing a write instruction W, a logical address LAD Hex03FFFFF0, and a 512 byte write data D512B is inputted from the information processing unit CPU_CHIP by way of the interface circuit HOST_IF of the memory module NVMSTR to the information processing circuit STCON (CPU), the information processing circuit STCON (CPU) converts the logical address LAD Hex03FFFFF0 to the physical address PAD Hex03FFFFF0 with reference to the correspondence table TLTBL shown in FIG. 15.

When the correspondence table TLTBL shown in FIG. 15 is stored in the memory device RAM, the information processing circuit STCON (CPU) reads the correspondence table TLTBL from the memory device RAM and converts the logical address LAD to the physical address PAD. When the correspondence table TLTBL shown in FIG. 15 is stored in the memory devices NVM10 to NVM13, the information processing circuit STCON (CPU) reads the correspondence table TLTBL from the memory devices NVM10 to NVM13 and converts the logical address LAD to the physical address PAD.

Since the physical address PAD Hex03FFFFF0 is allocated to the Hex03FFFFFF address of the sector address NSAD of the memory device NVM10, and the Hex0 address of the page address NPAD in the Hex03FFFFF address of the sector address NPAD, the information processing circuit STCON (CPU) outputs the write instruction W10, Hex03FFFFF address of the sector address NSAD, the Hex0 address of the page address NPAD in the Hex03FFFFF address of the sector address NSAD, and a 512 byte write data D512B only to the memory device NVM10 by way of the arbiter circuit ARB and the memory control device NVCT0.

Then, the memory device NVM10 writes a 512 byte data to the address designated by the 0 address of the sector address NSAD and the Hex0 address of the page address NNPAD in the Hex03FFFFF address of the sector address NSAD.

FIG. 16B shows an operation when a 1 Kbyte data is inputted from the information processing unit CPU_CHIP to the memory devices NVM10 to NVM13 with the logical address LAD Hex03FFFFF0 address being as the starting address.

When a write demand WRQ1 containing a write instruction W, a logical address LAD Hex03FFFFF0, and a 1 Kbyte write data D1 KB is inputted from the information processing unit CPU_CHIP by way of the interface circuit HOST_IF of the memory module NVMSTR to the information processing circuit STCON (CPU), the information processing circuit STCON (CPU) converts the logical address LAD Hex03FFFFF0 to the physical address PAD Hex03FFFFF0 with reference to the correspondence table TLTBL shown in FIG. 15.

Since the physical address PAD Hex03FFFFF0 is allocated to the Hex03FFFFFF address of the sector address NSAD of the memory device NVM10, and the Hex0 address of the page address NPAD in the Hex03FFFFF address of the sector address NSAD, the information processing circuit STCON (CPU) outputs the write instruction W10, the Hex03FFFFF address of the sector address NSAD, the Hex0 address of the page address NPAD in the Hex03FFFFF address of the sector address NSAD, and a 1 Kbyte write data D512B by way of the arbiter circuit ARB and the memory control device NVCT0 only to the memory device NVM10.

Then, the memory device NVM10 writes a 512 byte data from the Hex0 address to the Hex 1 address of the page address NPAD with the address designated by the Hex03FFFFF address of the sector address NSAD and the Hex0 address of the page address NPAD in the Hex03FFFFF address of the sector address NSAD being as the start address.

FIG. 16C shows an operation when a 2 Kbyte data is inputted from the information processing unit CPU_CHIP to the memory devices NVM10 to NVM13 with the logical address LAD Hex03FFFFF0 address being as the starting address.

When a write demand WRQ2 containing a write instruction W, a logical address LAD Hex03FFFFF0 address, and a 2 Kbyte write data D2 KB is inputted from the information processing unit CPU_CHIP by way of the interface circuit HOST_IF of the memory module NVMSTR to the information processing circuit STCON (CPU), the information processing circuit STCON (CPU) converts the logical address LAD Hex03FFFFF0 to the physical address PAD Hex03FFFFF0 with reference to the correspondence table TLTBL shown in FIG. 15.

Since the physical address PAD Hex03FFFFF0 is allocated to the Hex03FFFFFF address of the sector address NSAD of the memory device NVM10, and the Hex0 address of the page address NPAD in the 03FFFFF address of the sector address NSAD, the information processing circuit STCON(CPU) outputs the write instruction W10, the Hex03FFFFF address of the sector address NSAD, the Hex0 address of the page address NPAD in the Hex03FFFFF address of the sector address NSAD, and a 2 Kbyte write data D2 KB by way of the arbiter circuit ARB and the memory control device NVCT0 only to the memory device NVM10.

Then, the memory device NVM10 writes a 512 byte data from the Hex0 address to the Hex 1 address of the page address NPAD with the address designated by the Hex03FFFFF address of the sector address NSAD and the Hex0 address of the page address NPAD in the Hex03FFFFF address of the sector address NSAD being as the start address.

FIG. 16D shows an operation when a 8 Kbyte data is inputted from the information processing unit CPU_CHIP to the memory devices NVM10 to NVM13 with the logical address LAD Hex03FFFFF0 address being as the starting address.

When a write demand WRQ8 containing a write instruction W, a logical address LAD Hex03FFFFF0 address, and a 8 Kbyte write data D8 KB is inputted from the information processing unit CPU_CHIP by way of the interface circuit HOST_IF of the memory module NVMSTR to the information processing circuit STCON (CPU), the information processing circuit STCON (CPU) converts the logical address LAD Hex03FFFFF0 to the physical address PAD Hex03FFFFF0 with reference to the correspondence table TLTBL shown in FIG. 15.

Since the physical address PAD Hex03FFFFF0 is allocated to the Hex03FFFFFF address of the sector address NSAD of the memory device NVM10, and the Hex0 address of the page address NPAD in the 03FFFFF address of the sector address NSAD, the information processing circuit STCON(CPU) outputs the write instruction W10, the Hex03FFFFF address of the sector address NSAD, the Hex0 address of the page address NPAD in the Hex03FFFFF address of the sector address NSAD, and a 8 Kbyte write data D8 KB by way of the arbiter circuit ARB and the memory control device NVCT0 only to the memory device NVM10.

Then, the memory device NVM10 writes a 512 byte data from the Hex0 address to the Hex 3 address of the page address NPAD with the address designated by the Hex03FFFFF address of the sector address NSAD and the Hex0 address of the page address NPAD in the Hex 15FFFFF address of the sector address NSAD being as the start address.

FIG. 16E shows an operation when a 10 Kbyte data is inputted from the information processing unit CPU_CHIP to the memory devices NVM10 to NVM13 with the logical address LAD Hex03FFFFF0 address being as the starting address.

When a write demand WRQ10 containing a write instruction W, a logical address LAD Hex03FFFFF0 address, and a 10 Kbyte write data D10 KB is inputted from the information processing unit CPU_CHIP by way of the interface circuit HOST_IF of the memory module NVMSTR to the information processing circuit STCON (CPU), the information processing circuit STCON (CPU) converts the logical address LAD Hex03FFFFF0 to the physical address PAD Hex03FFFFF0 with reference to the correspondence table TLTBL shown in FIG. 15.

Further, since the write data exceeds 8 Kbytes (1 sector=512 bytes×16 pages), the control circuit STRCT0 determines the first logical address LAD Hex04000000 exceeding 16 pages from the logical address LAD Hex03FFFFF0, and converts the logical address LAD Hex04000000 to the physical address PAD Hex04000000.

The physical address PAD Hex03FFFFF0 is allocated to the Hex03FFFFFF address of the sector address NSAD of the memory device NVM10, and the Hex0 address of the page address NPAD in the Hex03FFFFF address of the sector address NSAD, and the physical address PAD Hex04000000 is allocated to the Hex0 address of the sector address NSAD of the memory device NVM11, and the Hex0 address of the page address NPAD in the Hex0 address of the sector address NSAD.

The information processing circuit STCON (CPU) outputs the write instruction W10, the Hex03FFFFF address of the sector address NSAD, the Hex0 address of the page address NPAD in the Hex03FFFFF address of the sector address NSAD, and the 8 Kbyte write data (the 8 Kbyte write data initially inputted to the memory module NVMSTR among the 10 Kbyte write data D10KB) by way of the arbiter circuit AKB and the memory control device NVCTR to the memory device NVM10. Further, the control circuit STRCT0 further outputs the write instruction W10, the Hex0 address of the sector address NSAD, the Hex0 address of the page address NPAD in the Hex0 address of the sector address NSAD, and the 2 Kbyte write data (write data for 2 Kbyte inputted finally to the memory module NVMSTR among the 10 Kbyte write data D10KB).

Then, the memory device NVM10 writes the 512 byte data from the Hex0 address to the Hex 15 address of the page address NPAD respectively with the address designated by the Hex03FFFFF address of the sector address NSAD and the Hex0 address of the page address NPAD in the Hex03FFFFF address of the sector address NSAD being as the start address respectively, and the memory device NVM11 writes the 512 byte data from the Hex0 address to the Hex 1 address of the page address NPAD respectively with the address designated by the Hex0 address of the sector address NSAD and the Hex0 address to the Hex( ) address of the page address NPAD being as the start address.

As has been described above, since the control circuit STRCT0 can control the memory devices NVM10 to NVM13 on 512 byte data unit in accordance with the minimum data control unit (512 byte) of the information processing unit CPU_CHIP, it can write the write demand of any size from the information processing unit CPU_CHIP in a shortest time and can cope with the demand flexibly. Further, the consumption power during operation can be decreased by driving only the memory devices (NVM10-NVM13) required for write operation.

Further, during the write operation to the memory device NVM10, a read operation to other memory device (NVM11 to NVM13) can be performed. That is, the write operation and the read operation can be performed simultaneously and high speed data transfer is possible.

<<Read Operation of Memory Module NVMNTR>>

FIG. 17A to FIG. 17E show the operation of the control circuit STRCT0 and the memory devices NVM10 to NMV13 when read demands of various data sizes are inputted from the information processing unit CPU_CHIP to the memory module NVMNTR.

FIG. 17A shows the operation of reading a 512 byte data from the memory devices NVM10 to NVM13 with the logical address LAD Hex03FFFFF0 address from the information processing unit CPU_CHIP being as a start address.

When a read demand RRQ05 containing a read instruction R, a logical address LAD Hex03FFFFF0 address, and a read cycle C1 for 512 byte data C1 (once) is inputted from the information processing unit CPU_CHIP by way of the interface circuit HOST_IF of the memory module NVMSTR to the information processing circuit STCOM (CPU), the information processing circuit STCOM (CPU) converts the logical address LAD of Hex03FFFFF0 to the physical address PAD of Hex03FFFFF0 with reference to the correspondence table TLTBL shown in FIG. 15.

When the correspondence table TLTBL shown in FIG. 15 is stored in the memory device RAM, the information processing circuit STCON (CPU) reads the correspondence table TLTBL from the memory device RAM and converts the logical address LAD to the physical address PAD. Further, when the correspondence table TLTBL shown in FIG. 15 is stored in the memory devices NVM10 to NVM13, the information processing circuit STCON (CPU) reads the correspondence table TLTBL from the memory devices NVM10 to NVM13, and converts the logical address LAD to the physical address PAD.

Since the physical address PAD Hex03FFFF0 is allocated to the Hex03FFFFF address of the sector address NSAD of the memory device NVM10 and the Hex0 address of the page address NPAD in the Hex03FFFFF address of the sector address NSAD, the information processing circuit STCON (CPU) outputs the read instruction RD4, the Hex03FFFFF address of the sector address NSAD, the Hex0 address of the page address NPAD in the Hex03FFFFF address of the sector address NSAD, and the read cycles C1 (once) for the 512 byte data by way of the arbiter circuit ARB and the memory control device NVCT0 only to the memory device NVM10.

Then, the memory device NVM10 reads the 512 byte data from the address designated by the Hex03FFFFF address of the sector address NSAD and the Hex0 address of the page address NPAD in the Hex03FFFFF address of the sector address NSAD.

FIG. 17B shows the operation of reading a 1 Kbyte data from the memory devices NVM10 to NVM13 with the logical address LAD Hex03FFFFF0 address from the information processing unit CPU_CHIP being as a start address.

When a read demand RRQ1 containing a read instruction R, a logical address LAD Hex03FFFFF0 address, and a read cycle C1 for 512 byte data C2 (twice) is inputted from the information processing unit CPU_CHIP by way of the interface circuit HOST_IF of the memory module NVMSTR to the information processing circuit STCOM (CPU), the information processing circuit STCOM (CPU) converts the logical address LAD of Hex03FFFFF0 to the physical address PAD of Hex03FFFFF0 with reference to the correspondence table TLTBL shown in FIG. 15.

Since the physical address PAD Hex03FFFF0 is allocated to the Hex03FFFFF address of the sector address NSAD of the memory device NVM10 and the Hex0 address of the page address NPAD in the Hex03FFFFF address of the sector address NSAD, the control circuit STRCT0 outputs the read instruction RD4, the Hex03FFFFF address of the sector address NSAD, the Hex0 address of the page address NPAD in the Hex03FFFFF address of the sector address NSAD, and the read cycles C2 (twice) for the 512 byte data byway of the memory control device NVCT0 only to the memory device NVM10.

Then, the memory device NVM10 reads a 512 byte data from the Hex0 address to the Hex1 address of the page address NPAD respectively with the address designated by the Hex03FFFFF address of the sector address NSAD and the Hex0 address of the page address NPAD in the Hex03FFFFF address of the sector address NSAD being as the start address.

FIG. 17C shows the operation of reading a 2 Kbyte data from the memory devices NVM10 to NVM13 with the logical address LAD Hex03FFFFF0 address from the information processing unit CPU_CHIP being as a start address.

When a read demand RRQ2 containing a read instruction R, a logical address LAD Hex03FFFFF0 address, and read cycles C4 for 512 byte data C4 (four times) is inputted from the information processing unit CPU_CHIP by way of the interface circuit HOST_IF of the memory module NVMSTR to the information processing circuit STCOM (CPU), the information processing circuit STCOM (CPU) converts the logical address LAD of Hex03FFFFF0 to the physical address PAD of Hex03FFFFF0 with reference to the correspondence table TLTBL shown in FIG. 15.

Since the physical address PAD Hex03FFFF0 is allocated to the Hex03FFFFF address of the sector address NSAD in the memory device NVM10 and the Hex0 address of the page address NPAD in the Hex03FFFFF address of the sector address NSAD, the information processing circuit STCON (CPU) outputs the read instruction RD4, the Hex03FFFFF address of the sector address NSAD, the Hex0 address of the page address NPAD in the Hex03FFFFF address of the sector address NSAD, and the read cycles C4 (four times) for the 512 byte data by way of the arbiter circuit ARB and the memory control device NVCT0 only to the memory device NVM10.

Then, the memory device NVM10 reads a 512 byte data from the Hex0 address to the Hex3 address of the page address NPAD respectively with the address designated by the Hex03FFFFF address of the sector address NSAD and the Hex0 address of the page address NPAD in the Hex03FFFFF address of the sector address NSAD being as the start address.

FIG. 17D shows the operation of reading a 8 Kbyte data from the memory devices NVM10 to NVM13 with the logical address LAD Hex03FFFFF0 address from the information processing unit CPU_CHIP being as a start address.

When a read demand RRQ8 containing a read instruction R, a logical address LAD Hex03FFFFF0 address, and read cycles C1 for 512 byte data C16 (16 times) is inputted from the information processing unit CPU_CHIP by way of the interface circuit HOST_IF of the memory module NVMSTR to the information processing circuit STCOM (CPU), the information processing circuit STCOM (CPU) converts the logical address LAD of Hex03FFFFF0 to the physical address PAD of Hex03FFFFF0 with reference to the correspondence table TLTBL shown in FIG. 15.

Since the physical address PAD Hex03FFFF0 is allocated to the Hex03FFFFF address of the sector address NSAD of the memory device NVM10 and the Hex0 address of the page address NPAD in the Hex03FFFFF address of the sector address NSAD, the information processing circuit STCON (CPU) outputs the read instruction RD4, the Hex03FFFFF address of the sector address NSAD, the Hex0 address of the page address NPAD in the Hex03FFFFF address of the sector address NSAD, and the read cycles C16 (16 times) for the 512 byte data by way of the arbiter circuit ARB and the memory control device NVCT0 only to the memory device NVM10.

Then, the memory device NVM10 reads a 512 byte data from the Hex0 address to the HexF address of the page address NPAD respectively with the address designated by the Hex03FFFFF address of the sector address NSAD and the Hex0 address of the page address NPAD in the Hex03FFFFF address of the sector address NSAD being as the start address.

FIG. 17E shows the operation of reading a 10 Kbyte data from the memory devices NVM10 to NVM13 with the logical address LAD Hex03FFFFF0 address from the information processing unit CPU_CHIP being as a start address.

When a read demand RRQ10 containing a read instruction R, a logical address LAD Hex03FFFFF0 address, and a read cycles C1 for 512 byte data C20 (20 times) is inputted from the information processing unit CPU_CHIP by way of the interface circuit HOST_IF of the memory module NVMSTR to the information processing circuit STCOM (CPU), the information processing circuit STCOM (CPU) converts the logical address LAD of Hex03FFFFF0 to the physical address PAD of Hex03FFFFF0 with reference to the correspondence table TLTBL shown in FIG. 15.

Further, since the read data exceeds 8 Kbytes (1 sector=512 bytes×16 pages), the information processing circuit STCON (CPU) determines the first logical address LAD Hex04000000 exceeding 16 pages from the logical address LAD Hex03FFFFF0, and converts the logical address LAD Hex04000000 to the physical address PAD Hex04000000.

Since the physical address PAD of Hex03FFFFF0 is allocated to the Hex03FFFFF address of the sector address NSAD of the memory device NVM10 and the Hex0 address of the page address NPAD in the 03FFFFF address of the sector address NSAD, and the physical address PAD of Hex04000000 is allocated to the Hex0 address of the sector address NSAD of the memory device NVM11, and the Hex0 address of the page address NPAD in the Hex0 address of the sector address NSAD, the information processing circuit STCON (CPU) outputs the read instruction RD4, the Hex03FFFFF address of the sector address NSAD, the Hex0 address of the page address NPAD in the Hex03FFFFF address of the sector address NSAD, and the read cycles C16 (16 times) of the 512 byte data by way of the arbiter circuit ARB and the memory control device NVCT0 to the memory device NVM10 and, at the same time, outputs the read instruction RD4, the Hex0 address of the sector address NSAD, the Hex0 address of the page address NPAD in the Hex0 address of the sector address NSAD, and the read cycles C4 (four times) of the 512 byte data by way of the memory control device NVCT1 to the memory device NVM11.

Then, the memory device NVM10 reads a 512 byte data from the Hex0 address to 15 address of the page address NPAD respectively with the address designated by the Hex03FFFFF of the sector address NSAD and the Hex0 address of the page address NPAD in the Hex03FFFFF address of the sector address NSAD being as the start address and, at the same time, the memory device NVM11 reads a 512 byte data from the Hex0 address to Hex 1 address of the page address NPAD respectively with the address designated by the Hex0 address of the sector address NSAD and the Hex0 address of the page address NPAD in the Hex0 address of the sector address NSAD being as start address.

As has been described above, since the control circuit STRCT0 can control the memory devices NVM10 to NVM13 on 512 byte data unit in accordance with the minimum data control unit (512 byte) of the information processing unit CPU_CHIP, it can read the read demand for of any size from the information processing unit CPU_CHIP in a shortest time and can cope with the demand flexibly. Further, the consumption power during operation can be decreased by driving only the memory devices (NVM10-NVM13) required for read operation.

Further, during the read operation to the memory device NVM10, a read operation to other memory device (NVM11 to NVM13) can be performed. That is, the read operation and the write operation can be performed simultaneously and high speed data transfer is possible.

<<Effect of this Embodiment>>

According to the embodiment, each of the effects can be obtained for each of the operations as described above and, since the memory module NVMSTR operates on the data unit easy to be controlled by the information processing unit CPU_CHIP and performs write and read operations in accordance with the data size upon read demand from the information processing unit CPU_CHIP, an information processing system containing a phase change memory easy to handle with and suitable to the memory module NVMSTR can be attained.

<<Modification of the Embodiment>>

Figure 21A:
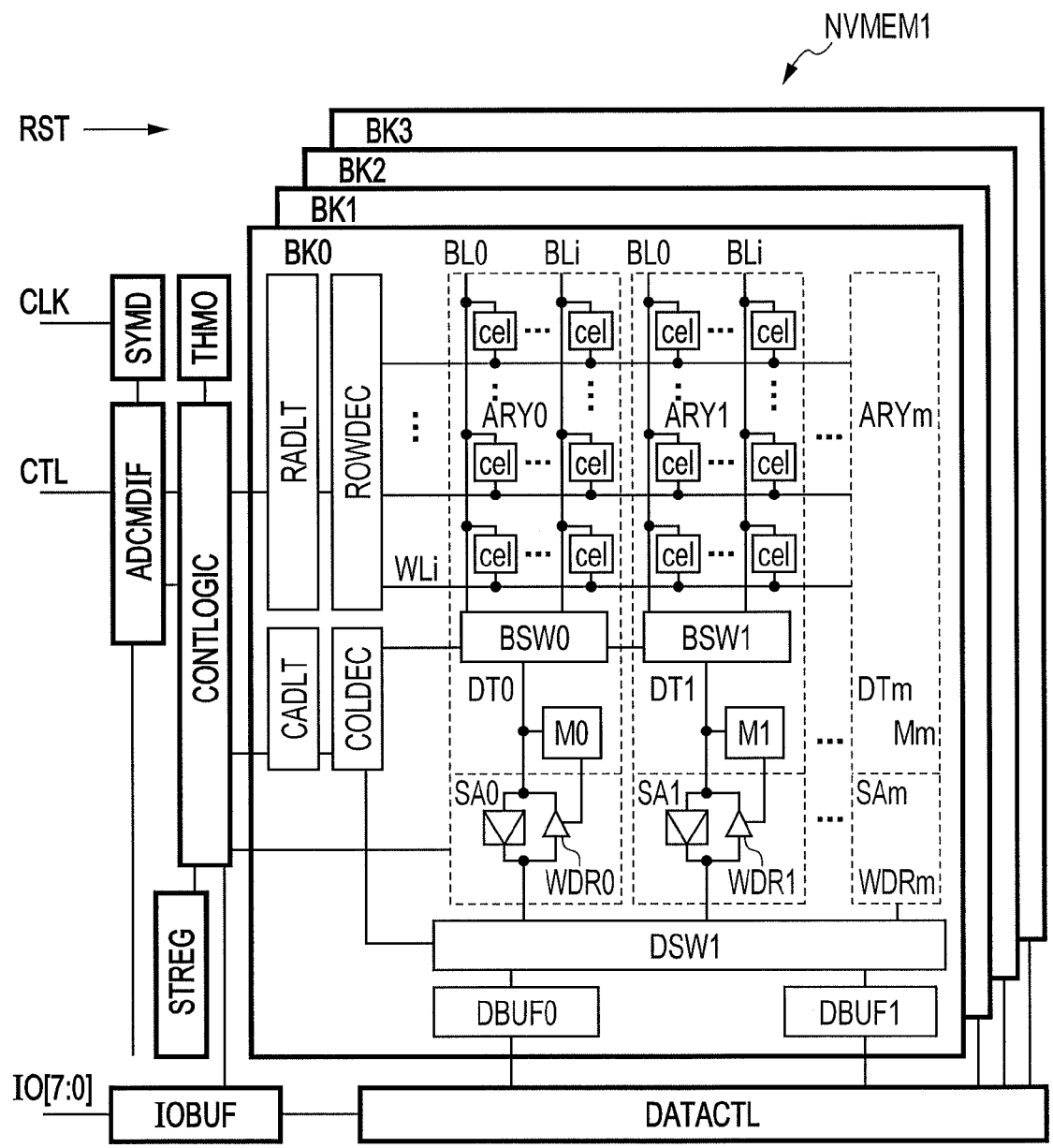
FIG. 21A is a block diagram showing an example of a circuit structure of a phase change memory device and FIG. 21B is a circuit diagram showing an example of a memory cell device.
Figure 21B:
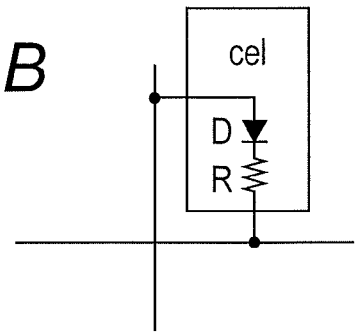

FIG. 21 is a block diagram showing another example of a circuit configuration for a non-volatile memory NVMEM1 utilized as memory devices NVM10-NVM14, in which a phase change non-volatile memory is shown as an example. FIG. 21A shows a circuit configuration of a non-volatile memory NVMEM1 and FIG. 21B shows a circuit configuration of a memory cell cel respectively.

The non-volatile memory NVMEM1 shown in FIG. 21 is different only in that a current sensor Mx (x=0 to m) is provided to each of the memory banks BK0 to BK3 of the non-volatile memory NVMEM shown in FIG. 2. The write operation of the non-volatile memory NVMEM1 is to be described.

FIG. 4 shows an example of write operation in which the non-volatile memory device NVM1x (x=0 to 4) writes a M byte data by way of the data buffer DBUF0 to the memory cell cel. "*", for example, in "m*n" in FIG. 4 and each of the succeeding drawings means "×" (multiplication).

A command latch enable signal CLE at a low level is driven into a high level and a chip enable signal CEB and a address latch enable signal ALE at a high level are driven to a low level. Then, when a write command W10 is inputted by way of the input/output line I/Ox (x=0 to 7), a write command W10 is put by the rising edge of the write enable signal WEB into the address command interface circuit ADCMDIF and decoded. Further, the command W10 also contains information for designating the data buffer DBUF0 or DBUF1 and the data buffer DBUF0 is designated in the example of FIG. 4.

Then, the command latch enable signal CLE at the high level is driven to a low level, and the address latch enable signal ALE at the low level is driven to a high level respectively. The column address is inputted in two steps (CA1, CA2) and the row address is inputted in three steps (RA1, RA2, RA3) orderly. The addresses are put into the address command interface circuit ADCMDIF by the rising edge of the write enable signal WEB and decoded.

As a result of decoding the address command W10 in the address command interface circuit ADCMDIF, when it is transmitted to the control circuit CONTLOGIC that this is the read instruction to the memory bank BK0, the control circuit CONTLOGIC activates the memory bank BK0 for reading the data from the memory bank BK0.

The row address (RA1, RA2, RA3) and the column address (CA1, CA2) inputted into the address command interface circuit ADCMDIF are transferred by way of the control circuit CONTLOGIC respectively to the activated row address latch circuit RADLT of the memory bank BK0 and transferred to the column address latch circuit CADLT. The write operation is started from the initially inputted column address.

The row address (RA1, RA2, RA3) is transferred from the row address latch circuit RADDLT to the row decoder ROWDEC, and the word line WLn corresponding to the row address (RA1, RA2, RA3) is selected by the row decoder ROWDEC.

Then, the column address (CA1, CA2) is transferred from the column address latch circuit CADLT to the column decoder COLDEC and decoded.

The result of decoding from the column decoder COLDEC is inputted to the bit line selection circuit BSW0-n of each of the memory arrays (ARY0-n), one bit line BL is selected on every memory array, and connected by way of the data line DT0-n to a write driver WDR0-n.

The write driver WDR0-n and the current form a current supply circuit for driving the selected memory cell cel to a low resistance or high resistance state by the current pulse as shown in FIG. 3.

The current supplied to the memory cell cel selected from the write driver WDR0-n is measured by a current sensor M0-n. Further, a current value IC0 when the selected memory cell cel is in a low resistance state and a current value IC1 for a high resistance state are set to the current sensor M0-n.

When the memory cell cel is driven to a high resistance state, that is, when storage information "0" is written, the current supplied from the write driver WDR0-n to the selected memory cell cel is measured by a current sensor M0-n and when the current value decreases to a current value IC1 or lower for the high resistance state, the current sensor M0-n instructs stopping of current supply to the write driver WDR0-n and the write driver WDR0-n stops the current supply in accordance with the instruction for stopping the supply of the current.

When the memory cell cel is driven to the low resistance state, that is, when a storage information "1" is written, a current supplied from the write driver WDR0-n to the selected memory cell cel is measured by a current sensor M0-n and, when the current value exceeds a current value IC0 for the low resistance state, the current sensor M0-n instructs stopping of current supply to the write driver WDR0-n, and the write driver WDR0-n stops the current supply in accordance with the instruction for stopping the current supply.

As described above, when the data is written to the memory cell cel, since the memory cell cel can be rewritten in a necessary and minimum current supply time by always measuring the current flowing to the memory cell cel, write operation at high speed and low current consumption can be attained.

<<Another Modification of the Embodiment>>

Figure 22:
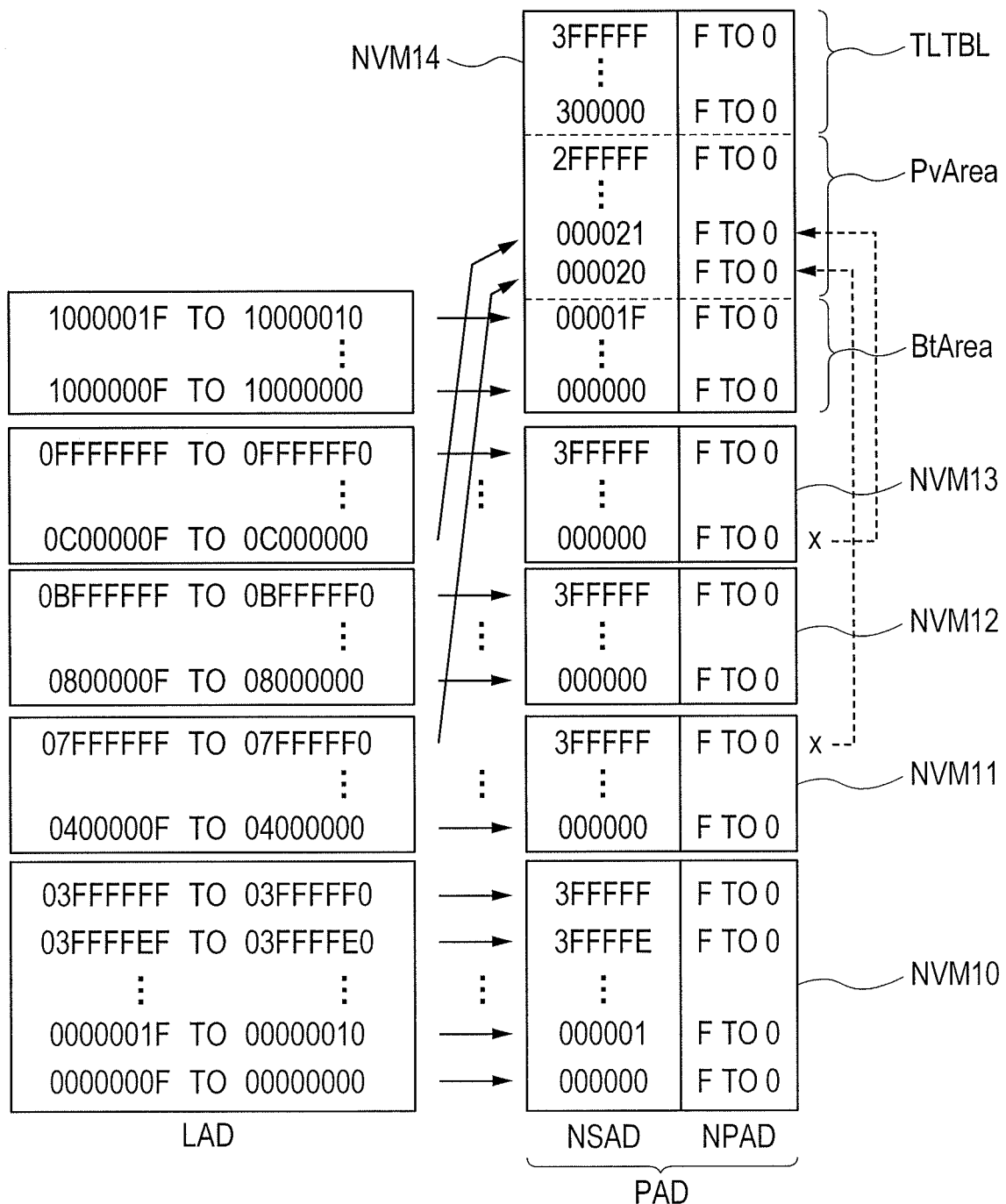
FIG. 22 shows an example of correspondence between logical address and physical address in a information processing system as a modified example of an embodiment according to the invention.

FIG. 22 shows another example of a correspondence table between a logical address LAD prepared by the information processing circuit STCON (CPU) and inputted from the information processing unit CPU_CHIP to the memory module NVMSTR upon initialize operation shown in FIG. 13 and a physical address PAD of the memory devices NVM10 to NVM14 (sector address NSAD+page address NPAD).

FIG. 22 is different from FIG. 15 in that the corresponding table between the logical address LAD prepared by the information processing circuit STCON (CPU) and inputted from the information processing unit CPU_CHIP to the memory module NVMSTR and the physical address PAD of the memory devices NVM10 to NVM14 (sector address NSAD+page address NPAD) is stored in the memory device NVM14.

The correspondence table described above is stored to 3000000 to 3FFFFFF of the physical address PAD in the memory device NVM 14.

As described above, by containing the correspondence table for the logical address LAD and the physical address PAD in the memory device NVM14, the store capacity of the memory device RAM contained in the control circuit STRCT0 can be decreased to reduce the cost for the control circuit STRCT0 and the memory module NVMSTR.

Further, since the memory device NVM14 is a non-volatile memory, and the correspondence table for the logical address LAD and the physical address PAD of the memory devices NVM10 to NVM14 (sector address NSAD+page address NPAD) is stored in the memory device NVM14, power supply to the memory module NVMSTR is interrupted accidentally, information of the correspondence table is not lost and highly reliable memory module NVMSTR can be attained.

While the invention made by the present inventors has been described specifically with reference to the preferred embodiments, the present invention is not restricted to such embodiments but it will be apparent that the invention can be modified variously within a range not departing from the gist thereof.

<<Appendix>>

The present invention concerns a semiconductor device (non-volatile memory), an information processing system, a memory module, a control device, etc. and has the following features.

(1) A semiconductor device comprising multiple memory cells each having rewritable resistive storage elements disposed at intersections between multiple word lines and multiple bit lines intersecting the word lines, and
a write driver for writing data to each of the memory cells respectively, in which
the write driver, when writing an M bit data, performs erase operation and program operation by M/n times in units of n bit (M>n) data.

(2) The semiconductor device according to (1) described above, in which
the size of target data for the erase operation and that for the program operation are identical.

(3) The semiconductor device according to (1) described above, in which
the resistance is set high for all of bits in the memory cells for n bits as the rewrite target in the erase operation, and the resistance is set low only for the data in the memory cells to which write data "1" is written in the memory cells for n bits as the rewrite target in the program operation.

(4) The semiconductor device according to (1) described above, in which
the resistance is set low for all bits in the memory cells for n bits as the rewrite target is set to a low resistance in the erase operation, and the resistance is set high only for the data of the write data "0" among the memory cells for n bits as the rewrite target in the program operation.

(5) The semiconductor device according to (1) described above, in which
the memory cell has a non-volatile storage elements.

(6) The semiconductor device according to (5) described above, in which
the memory cell has a resistance change storage element.

(7) The semiconductor device according to (6) described above, in which
the memory cell has phase change storage element.

(8) A semiconductor device comprising multiple memory cells each having rewritable resistive storage elements disposed at intersections between multiple word lines and multiple bit lines intersecting the word lines, and
a write driver for writing data to each of the memory cells respectively, in which
the write driver, when writing an M bit data, performs program operation in units of n bits (M>n) data.

(9) The semiconductor device according to (8) described above, in which
only the write data for "1" is set to a low resistance in the memory cells for n bits as rewrite target, or only the data "0" for the write data is set to high resistance in the memory cells for n bits as the write target in the program operation.

(10) A semiconductor device comprising multiple memory cells each containing rewritable resistive storage elements disposed at interconnection between the word lines and multiple bit lines intersecting with the word lines, and
a circuit for reading data held in the memory cells, in which the circuit performs read operation for M/n times in units of n bits (M>n) data when reading M bit data from the memory cells.

(11) The semiconductor device according to (10) described above,
further including
multiple buffers for holding data read from the memory cells, in which
when transferring M bit data from the memory cells to the buffers, transfer operation is performed in units of n bit (M>n) data by M/n times to the buffers designated by a read instruction inputted to the semiconductor device.

(12) The semiconductor device according to (11) described above, in which
data is read directly from the buffers designated by a read instruction inputted to the semiconductor device.

(13) An information processing system comprising an information processing device, a control device, and a memory device in which
the control device is a device for controlling the memory device in accordance with a write demand from the information processing device,
the memory device includes a memory bank and a buffer,
the write demand contains a write instruction, a first write address, a write data size, and a write data, and
the control device transfers the write data only for the write data size to the buffer in accordance with the write instruction from the information processing device and utilizing the first write address, and then writes the data to the memory bank.

(14) The information processing system according to (13) described above, in which
the control device is a device for controlling the memory device in accordance with the read demand from the information processing device,
the memory device includes a memory bank and a buffer,
the read demand contains a read instruction, a first read address, and a read data size, and
the control device transfers the data only for the read data size from the memory bank to the buffer, then reads the data from the memory device, and transfers the data to the information processing device in accordance with the read instruction from the information processing device, with the first read address being as a start address.

(15) The information processing system according to (14) described above, in which
the control device is a device for outputting an erase demand to the memory device,
the erase demand contains an erase instruction, an erase address, and an erase data size, and
the memory device erases the data only for the erase data size from the memory bank in accordance the erase instruction from the control device and utilizing the erase address.

(16) The information processing system according to (13) described above, in which
the control device has a correspondence information for taking correspondence between the first write address and the second write address of the memory device, and
the control device converts the first write address to the second write address by utilizing the correspondence information and then performs write operation to the memory device, by utilizing the second write address.

(17) The information processing system according to (14) described above, in which
the control device has a corresponding information for taking correspondence between the first read address and the second read address of the memory device, and the control device converts the first read address to the second read address by utilizing the correspondence information and then performs read operation to the memory device, by utilizing the second read address.

(18) A semiconductor device comprising a first memory bank and a second memory bank each having multiple storage elements for storing data, in which
the first memory bank has a first buffer and a second buffer, the second memory bank has a third buffer and a fourth buffer, in which
the control circuit performs read operation from the first memory bank to the second buffer during write operation to the first buffer.

(19) The semiconductor device according to (18) described above, in which
the control circuit reads the second data held in the second buffer during writing of the first data held in the first buffer to the first memory bank.

(20) A semiconductor device comprising a first memory bank and a second memory bank each having multiple storage elements for storing data, in which
the first memory bank has a first buffer and a second buffer, the second memory bank has a third buffer and a fourth buffer, in which
the control circuit
performs read operation for data held in the second memory bank during write operation of the data held in the first buffer to the first memory bank.

(21) The semiconductor device according to (20) described above, in which
the control circuit performs read operation for the data held in the second memory bank during erase operation for the data held in the first memory bank.

(22) The semiconductor device according to (21) described above, in which
the control circuit performs read operation for the data held in the second memory bank during read operation for the data from the first memory bank to the first buffer.

(23) A semiconductor device comprising a first memory bank and a second memory bank each having multiple storage elements for storing data and a control circuit in which
the first memory bank has a first buffer and a second buffer, and
the second memory bank has a third buffer and a fourth buffer, in which
the control circuit performs data write operation to the second memory bank during write operation of the data held in the first buffer to the first memory bank.

(24) The semiconductor device according to (23) described above, in which
the control circuit performs write operation for data held in the second memory bank during erase operation for data held in the first memory bank.

(25) The semiconductor device according to (24) described above, in which
the control circuit performs write operation for data held in the second memory bank during read operation for a data from the first memory bank to the first buffer.

(26) A memory module comprising a control device and a memory device, in which
the control device is a device for controlling the memory device by a write demand inputted to the control device,
the memory device includes a memory bank and a buffer,
the write demand contains a write instruction, a first write address, a write data size, and a write data, and
the control device transfers the write data only for the write data size to the buffer and then write the data to the memory bank in accordance with the write instruction and by utilizing the first write address.

(27) The memory module according to (26) described above, in which
the control device is a device for controlling the memory device in accordance with the read demand inputted to the control device,
the memory device includes a memory bank and a buffer,
the read demand contains a read instruction, a first read address, and a read data size, and
the control device transfers the data only for the read data size from the memory bank to the buffer and then reads the data from the memory device in accordance with the read instruction and by utilizing the first read address.

(28) The memory module according to (27) described above, in which
the control device is a device for outputting a erase demand to the memory device,
the erase demand contains an erase instruction, an erase address, and an erase data size, and
the memory device erases the data only for the erase data size from the memory bank in accordance with the erase instruction from the control device and by utilizing the erase address.

(29) The memory module according to (26) described above, in which
the control device has a correspondence information for taking correspondence between the first write address and the second write address of the memory device, and
the control device converts the first write address to the second write address by utilizing the correspondence information and then performs write operation to the memory device by utilizing the second write address.

(30) The memory module according to (27) described above, in which,
the control device has a correspondence information for taking correspondence between the first read address and the second read address of the memory device, and
the control device converts the first read address to the second read address by utilizing the correspondence information and then performs read operation to the memory device and by utilizing the second read address.

(31) The memory module according to (26) described above, in which
the memory device is a non-volatile memory.

(32) The memory module according to (31) described above, in which
the memory device is a resistance change memory.

(33) The memory module according to (32) described above, in which
the memory device is a phase change memory.

(34) A control device for controlling a memory device in accordance with a write demand inputted to the control device, in which
the memory device includes a memory bank and a buffer,
the write demand contains a write instruction, a first write address, a write data size, and a write data, and
the control device transfers the write data only for the write data size to the buffer and then writes the data to the memory bank in accordance with the write instruction and by utilizing the first write address.

(35) The control device according to (34) described above, in which
the control device is a device for controlling the memory device in accordance with a read demand inputted to the control device,
the memory device includes a memory bank and a buffer,
the read demand contains a read instruction, a first read address, and a read data size, and
the control device transfers the data only for the read data size from the memory bank to the buffer and then read the data from the memory device in accordance with the read instruction and by utilizing the first read address.

(36) The control device according to (35) described above, in which
the control device is a device for outputting an erase demand to the memory device,
the erase demand contains a erase instruction, an erase address, and a erase data size, and
the memory device erases the data only for the erase data size from the memory bank in accordance with the erase instruction from the control device and by utilizing the erase address.

(37) The control device according to (34) described above, in which
the control device further has a correspondence information for taking correspondence between the first write address and the second write address of the memory device, and
the control device converts the first write address to the second write address utilizing the correspondence information and then performs write operation to the memory device by utilizing the second write address.

(38) The control device according to (35) described above, in which
the control device has a correspondence information for taking correspondence between the first read address and the second read address of the memory device, and
the control device converts the first read address to the second read address by utilizing the correspondence information and then performs read operation to the memory device by utilizing the second read address.

(39) The control device according to (34) described above, in which
the memory device is a non-volatile memory.

(40) The control device according to (39) described above, in which
the memory device is a resistance change memory.

(41) The control device according to (40) described above, in which
the memory device is a phase change memory.

According to the semiconductor device of the present invention, since the memory operates as a storage on the data unit easy to control from the host, write and read operation are performed in accordance with the data size upon write or read demand from the host. Further, since simultaneous operation is possible between different memory banks and in one identical memory bank in the memory device, it is applicable to a semiconductor device capable of data transfer at high speed, easy to be handled with, and suitable to a storage.

What is claimed is:
1. A semiconductor device comprising:
a plurality of memory cells each having rewritable resistive storage elements disposed at intersections between a plurality of word lines and a plurality of bit lines intersecting the word lines; and
a write driver for writing data to each of the memory cells respectively,
wherein the write driver, when writing an M bit data, performs erase operation and program operation in units of n bit (M>n) data.

2. The semiconductor device according to claim 1,
wherein the size of target data for the erase operation and that for the program operation are identical.

3. The semiconductor device according to claim 1,
wherein the resistance is set high for all of the resistive storage elements in the memory cell for n bits as the rewrite target in the erase operation, and the resistance is set low only for the resistive storage elements in the memory cell to which write data "1" is written in the memory cell for n bits as the rewrite target in the program operation.

4. The semiconductor device according to claim 1,
wherein the resistance is set low for all the resistive storage elements in the memory cell for n bits as the rewrite target in the erase operation, and the resistance is set high only for the resistive storage elements in the memory cell to which the write data "0" is written among the memory cells for n bits as the rewrite target in the program operation.

5. The semiconductor device according to claim 1,
wherein the memory cell has a non-volatile storage element.

6. The semiconductor device according to claim 5,
wherein the memory cell has a resistance change storage element.

7. The semiconductor device according to claim 6,
wherein the memory cell has a phase change storage element.

8. The semiconductor device according to claim 1,
wherein the write driver, when writing an M bit data performs a program operation in units of n bit (M>n) data.

9. The semiconductor device according to claim
wherein the resistance is set low only for the resistive storage elements in the memory cell to which the write data "1" is written among the memory cells for n bits as the rewrite target in the program operation.

10. The semiconductor device according to claim 8,
wherein only the resistance of the resistive storage elements to which "0" data is written among the memory cells for n bits as the rewrite target in the program operation.

11. The semiconductor device according to claim 1, further comprising:
a circuit for reading data held in the memory cell,
wherein the circuit, when reading M bit data from the memory cell, performs read operation in units of n bits (M>n) data.

12. The semiconductor device according to claim 11, further comprising:
a plurality of buffers for holding data read from the memory cell,
wherein, when transferring M bit data from the memory cell to the buffer, transfer operation is performed in units of n bit (M>n) data to the buffer designated by a read instruction inputted to the semiconductor device.

13. The semiconductor device according to claim 12,
wherein a data is directly read from the buffer designated by a read instruction inputted to the semiconductor device.

14. A data processing system comprising a data processing device, a control device and a memory device,
wherein the control device is a device for controlling the memory device in accordance with a write demand from the data processing device, wherein the memory device includes a memory bank and a buffer, wherein the write demand contains a write instruction, a first write address, a write data size, and a write data, and wherein the control device transfers the write data only for the write data size to the buffer in accordance with the write instruction from the data processing device and with the first write address being as a start address, and then writes the data to the memory bank.

15. The data processing system according to claim 14, wherein the control device is a device for controlling the memory device in accordance with the read demand from the data processing device, wherein the memory device includes a memory bank and a buffer, wherein the read demand contains a read instruction, a first read address, and a read data size, and wherein the control device transfers the data only for the read data size from the memory bank to the buffer, then reads the data from the memory device, and transfers the data to the data processing device in accordance with the read instruction from the data processing device, with the first read address being as a start address.

16. The data processing system according to claim 15, wherein the control device is a device for outputting an erase demand to the memory device, wherein the reads demand contains an erase instruction, an erase address, and an erase data size, and wherein the memory device erases the data only for the erase data size from the memory bank in accordance with the erase instruction from the control device, with the erase address being as a start address.

17. The data processing system according to claim 14, wherein the control device has a correspondence information for taking correspondence between the first write address and the second write address of the memory device, and wherein the control device converts the first write address to the second write address by utilizing the correspondence information and then performs write operation to the memory device, with the second write address being as a start address.

18. The data processing system according to claim 15, wherein the control device has a corresponding information of taking correspondence between the first read address and the second read address of the memory device, and wherein the control device converts the first read address to the second read address by utilizing the correspondence information and then performs read operation to the memory device, with the second read address being as a start address.

19. A semiconductor device comprising:

a first memory bank and a second memory bank each having a plurality of storage elements for storing data, the first memory bank having a first buffer and a second buffer, and the second memory bank having a third buffer and a fourth buffer, wherein the control circuit performs read operation from the first memory bank to the second buffer during write operation to the first buffer, or reads the second data held in the second buffer during writing of the first data held in the first buffer to the first memory bank.

20. The semiconductor device according to claim 19, wherein the control circuit performs read operation for data held in the second memory bank during write operation of the data held in the first buffer to the first memory bank, or performs read operation for the data held in the second memory bank during erase operation for the data held in the first memory bank, or performs read operation for the data held in the second memory bank during read operation for the data from the first memory bank to the first buffer.

* * * * *